United States Patent
Gupta et al.

(10) Patent No.: US 10,573,388 B2
(45) Date of Patent: Feb. 25, 2020

(54) NON-VOLATILE STORAGE SYSTEM WITH ADJUSTABLE SELECT GATES AS A FUNCTION OF TEMPERATURE

(71) Applicant: Western Digital Technologies, Inc., San Jose, CA (US)

(72) Inventors: Mahim Raj Gupta, Milpitas, CA (US); Mohsen Purahmad, Sunnyvale, CA (US); Bo Lei, San Ramon, CA (US); Joanna Lai, San Jose, CA (US); Xiying Costa, San Jose, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 15/944,917

(22) Filed: Apr. 4, 2018

(65) Prior Publication Data
US 2019/0311770 A1   Oct. 10, 2019

(51) Int. Cl.
*G11C 16/10* (2006.01)
*G11C 16/04* (2006.01)
(Continued)

(52) U.S. Cl.
CPC .......... *G11C 16/10* (2013.01); *G11C 16/0483* (2013.01); *G11C 16/14* (2013.01); *G11C 16/26* (2013.01); *G11C 16/34* (2013.01); *G11C 11/5671* (2013.01); *H01L 27/1157* (2013.01); *H01L 27/11565* (2013.01); *H01L 27/11582* (2013.01)

(58) Field of Classification Search
CPC ..... G11C 16/10; G11C 16/0483; G11C 16/34; G11C 16/14; G11C 16/26; H01L 27/1157
See application file for complete search history.

(56) References Cited

U.S. PATENT DOCUMENTS 7,463,528 B2   12/2008   Mokhlesi
8,867,271 B2   10/2014   Li
(Continued)

OTHER PUBLICATIONS

PCT International Search Report dated May 17, 2019, PCT Patent Application PCT/US2019/016718.
(Continued)

*Primary Examiner* — Alfredo Bermudez Lozada
(74) *Attorney, Agent, or Firm* — Vierra Magen Marcus LLP

(57) ABSTRACT

A non-volatile storage system comprises memory cells arranged in groups of memory cells that include programmable select gates and one or more control circuits in communication with the memory cells. The one or more control circuits configured to identify a select gate that needs to be programmed and program the select gate identified to be programmed if a temperature at the non-volatile memory cells is greater than a minimum temperature and defer programming of the select gate identified to be programmed until the temperature at the non-volatile memory cells is greater than the minimum temperature. In some embodiments, the one or more control circuits are configured to perform dummy memory operations on the plurality of non-volatile memory cells to raise the temperature of the non-volatile memory cells in response to determining that the temperature at the non-volatile memory cells is not high enough.

15 Claims, 24 Drawing Sheets

(51) Int. Cl.
*G11C 16/34* (2006.01)
*G11C 16/14* (2006.01)
*G11C 16/26* (2006.01)
H01L 27/11582 (2017.01)
*G11C 11/56* (2006.01)
H01L 27/11565 (2017.01)
H01L 27/1157 (2017.01)

(56) References Cited

U.S. PATENT DOCUMENTS

| | | |
|---|---|---|
| 8,913,432 B2 | 12/2014 | Dong |
| 2010/0238729 A1 | 9/2010 | Lee |
| 2011/0211392 A1 | 9/2011 | Kim |
| 2011/0249503 A1 | 10/2011 | Yamada |
| 2012/0327713 A1 | 12/2012 | Parat |
| 2014/0198575 A1* | 7/2014 | Dutta ............... G11C 16/3418 365/185.17 |
| 2014/0204694 A1 | 7/2014 | Choy |
| 2014/0269070 A1 | 9/2014 | Hsiung |
| 2014/0369129 A1 | 12/2014 | Dutta et al. |
| 2016/0293266 A1 | 10/2016 | Chen et al. |
| 2017/0071056 A1* | 3/2017 | Stoev ................ H05K 1/0212 |
| 2017/0256317 A1 | 9/2017 | Nguyen |

OTHER PUBLICATIONS

PCT Written Opinion of the International Searching Authority dated May 17, 2019, PCT Patent Application PCT/US2018/016718.

* cited by examiner

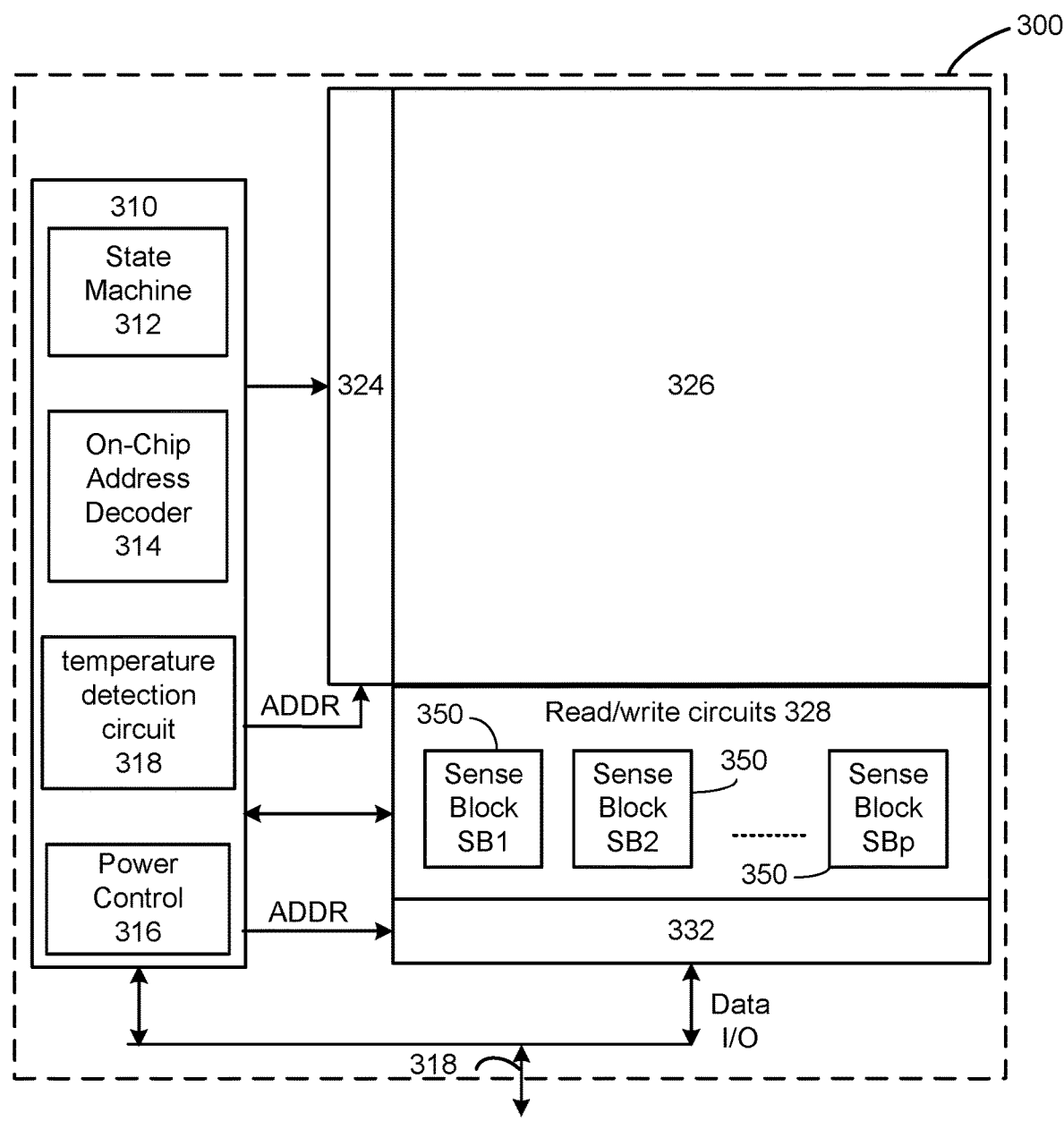

Figure 4D
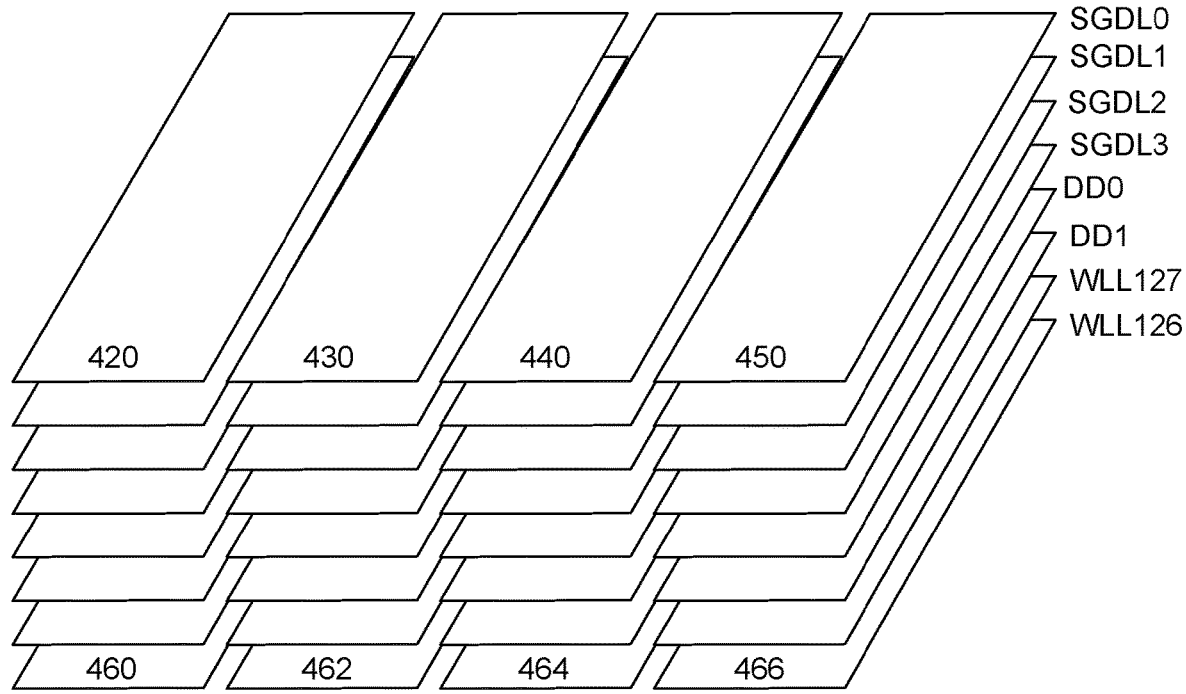
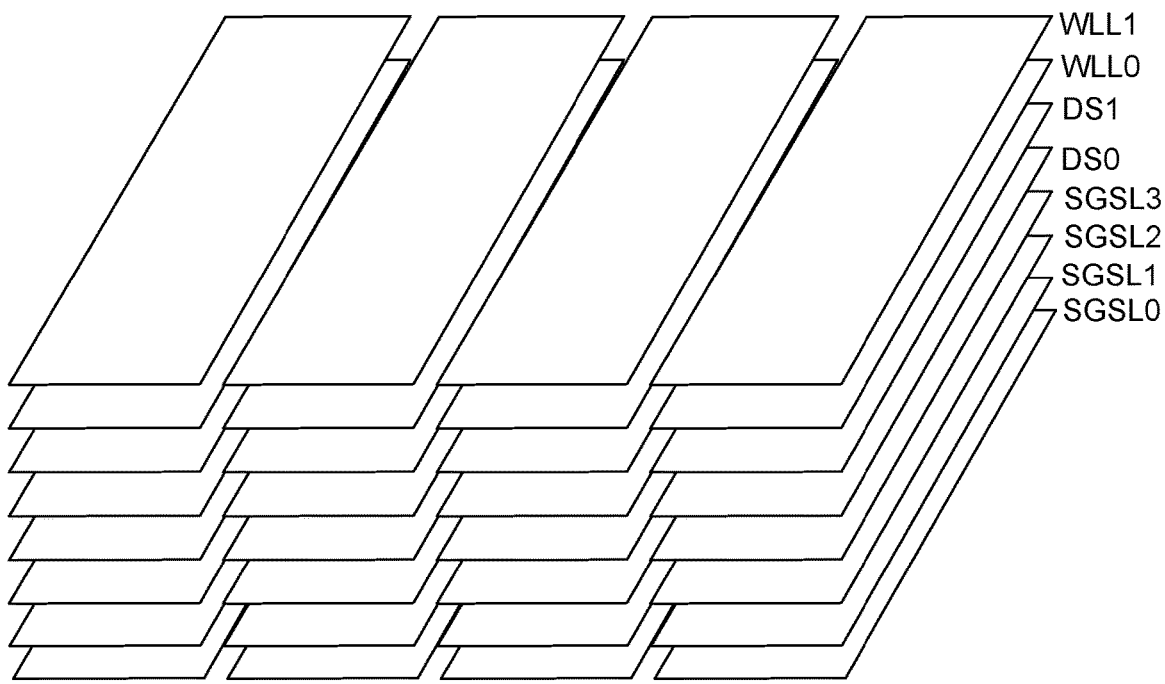

|  | S0 | S1 | S2 | S3 | S4 | S5 | S6 | S7 |
|---|---|---|---|---|---|---|---|---|
| Upper Page | 1 | 1 | 1 | 0 | 0 | 0 | 0 | 1 |
| Middle Page | 1 | 1 | 0 | 0 | 1 | 1 | 0 | 0 |
| Lower Page | 1 | 0 | 0 | 0 | 0 | 1 | 1 | 1 |

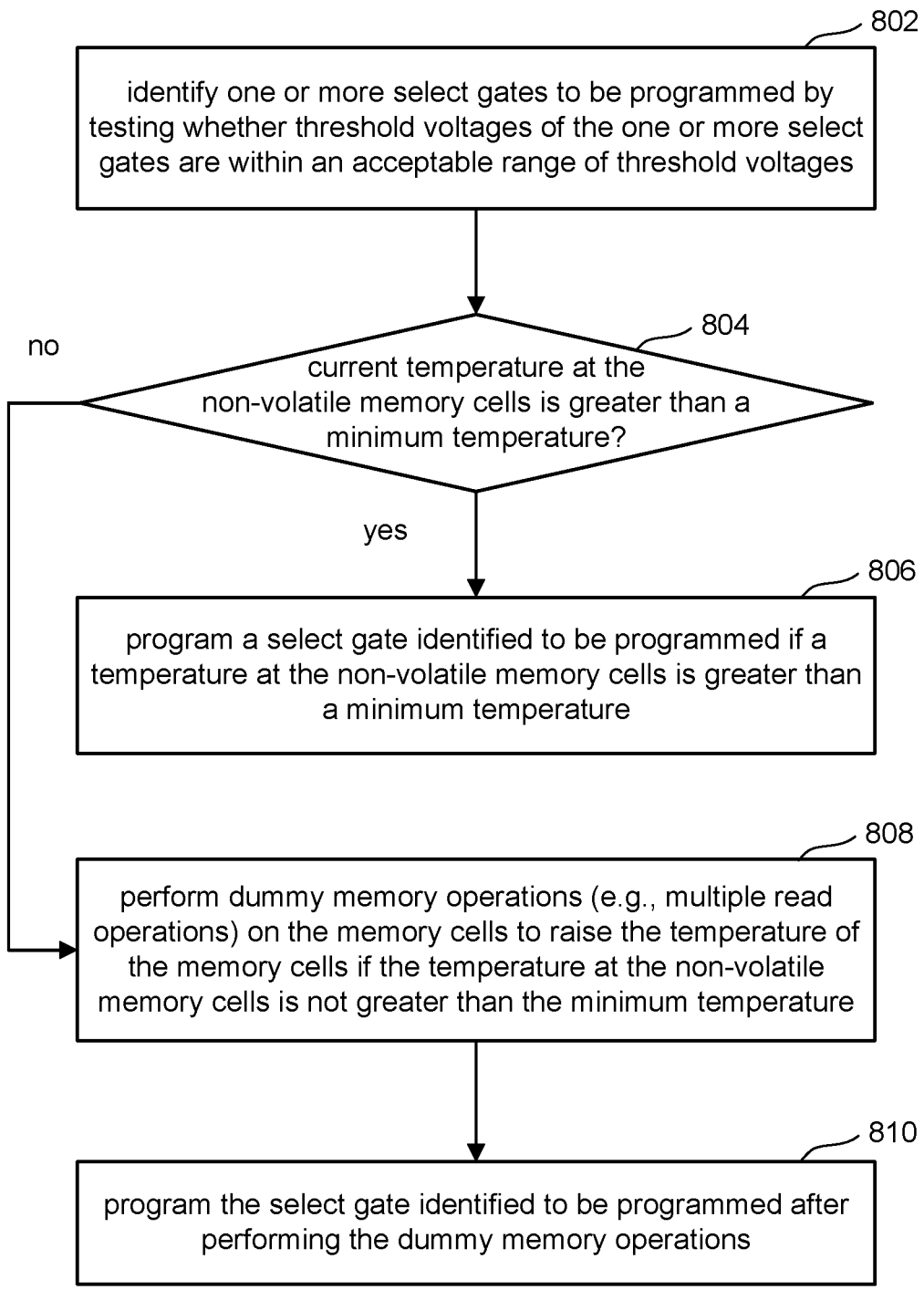

NON-VOLATILE STORAGE SYSTEM WITH ADJUSTABLE SELECT GATES AS A FUNCTION OF TEMPERATURE

BACKGROUND

Semiconductor memory is widely used in various electronic devices such as cellular telephones, digital cameras, personal digital assistants, medical electronics, mobile computing devices, non-mobile computing devices and data servers. Semiconductor memory may comprise non-volatile memory or volatile memory. A non-volatile memory allows information to be stored and retained even when the non-volatile memory is not connected to a source of power (e.g., a battery). Examples of non-volatile memory include flash memory (e.g., NAND-type and NOR-type flash memory), Electrically Erasable Programmable Read-Only Memory (EEPROM), and others.

When a memory system is deployed in or connected to an electronic device (the host), the memory system can be used to store data and read data. It is important that writing and reading is performed accurately, so that data is not lost.

BRIEF DESCRIPTION OF THE DRAWINGS

Like-numbered elements refer to common components in the different figures.

FIG. 2 is a block diagram of one embodiment of a memory die.

FIG. 4D depicts a view of the select gate layers and word line layers.

FIG. 15 is a flow chart describing one embodiment of a process for adjusting (e.g. programming or otherwise changing) threshold voltages of select gates as a function of temperature.

DETAILED DESCRIPTION

Figure 1A:
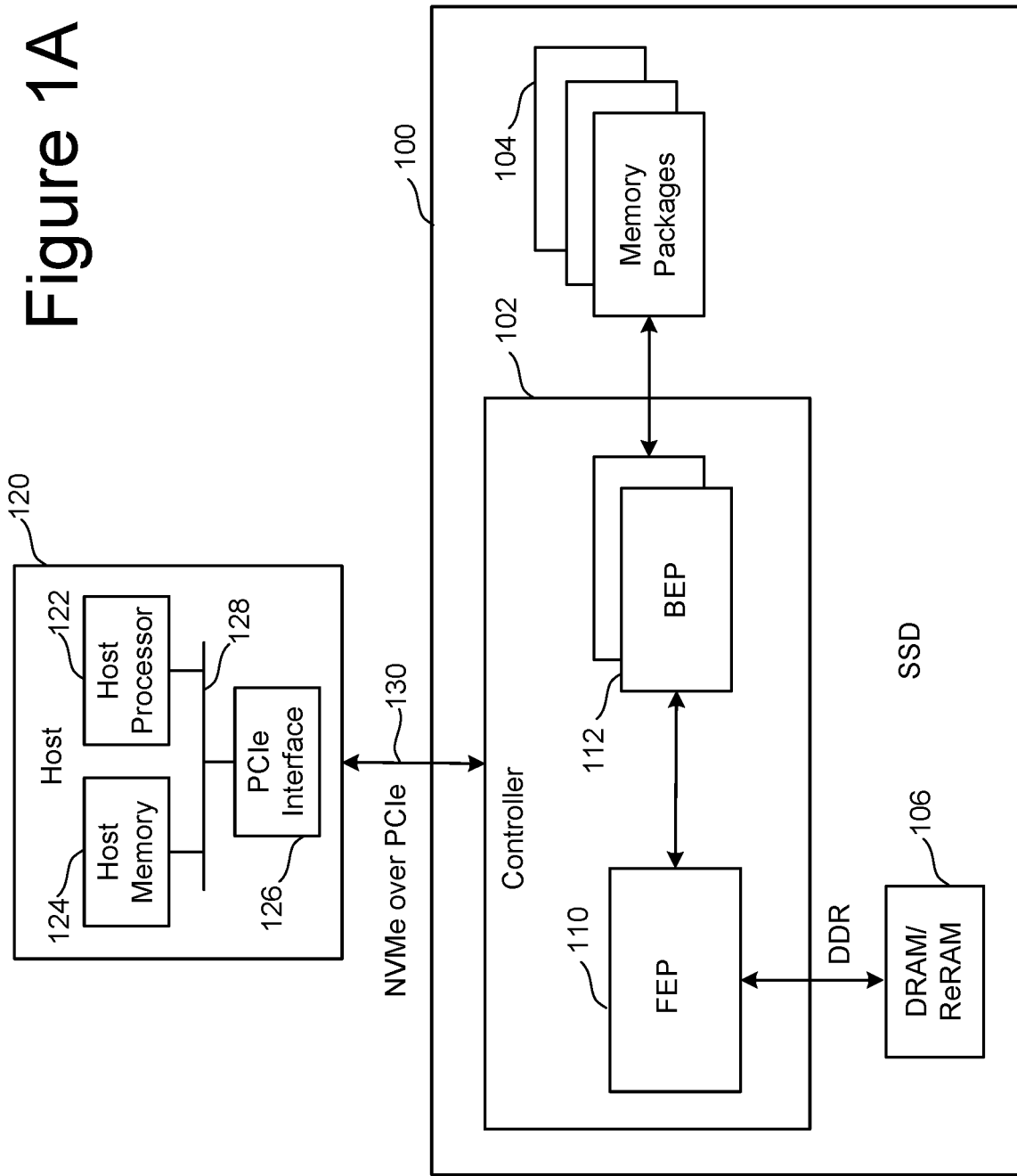
FIG. 1A is a block diagram of one embodiment of a memory system connected to a host.

Some non-volatile memory devices include series-connected memory cells such as, for example, NAND strings (2D or 3D). A drain end of the series-connected memory cells is connected to a bit line and has a drain side select gate which controls whether the bit line communicates with the memory cells. A source end of the series-connected memory cells is connected to a source line and has a source side select gate which controls whether the source line communicates with the memory cells. For purposes of this document, a select gate is a switch that can be used to connect or disconnect s group of memory cells from a signal line (e.g., bit line or source line). In one example, a select gate is implemented by a transistor; however, other devices can also be used. The memory cells used to store data can be referred to as data memory cells. Select gates are not data memory cells.

The select gates are controlled according to whether erasing, programming or sensing operations are to be performed on the data memory cells (hereinafter, data memory cells will also be referred to as a memory cells). For example, the drain side select gates can have a control gate voltage Vsgd (also referred to as a control signal) which has to be within a specified window or range. To program memory cells in a NAND string, the drain end of the NAND string is connected to a bit line voltage which is grounded (0 V) or set to a relatively low non-zero voltage to allow programming to occur. Vsgd should be sufficiently high to make the drain side select gate conductive and pass this bit line voltage to the memory cells. For example, Vsgd>Vbl+Vth_sg, where Vth is the threshold voltage of the drain side select gate transistor and Vbl is the bit line voltage. To inhibit a NAND string from programming, the drain side select gate transistor is made non-conductive. The drain end of the NAND string is connected to a bit line voltage which is set to a relatively high non-zero voltage, which inhibits programming from occurring. Vsgd should be low enough so that the drain side select gate transistor is made non-conductive. This requires Vsgd<Vbl+Vth_sg.

However, the threshold voltage (Vth) can vary for different drain side select gate transistors due to normal process variations. The Vth of different drain side select gate transistors typically has a distribution about a median value. To minimize errors, the Vth distribution of the select gates should be a narrow as possible. The Vth can be adjusted by process variations during fabrication (device engineering), e.g., variations in physical dimensions such as recess step, body thickness and radius, and variations in drain implantation/doping. However, the effectiveness of such process variations is limited and they are difficult and expensive to control. Additionally, the Vth distribution can vary over time as additional program-erase cycles are experienced by the memory device. A program-erase cycle includes the combination of erasing and programming the same set of memory cells. In systems that write 0's and 1's rather than "program" and "erase" the program-erase can refer to the each time there is a writing of data.

Techniques provided herein allow evaluation and adjustment of the threshold voltage (or other non-volatile property) of select gates independent of the device engineering. It has been observed by the present inventors that the adjusting (e.g. programming or otherwise changing) of the threshold voltage of the select gates at lower temperatures can lead to less precise control of the target threshold voltage as compared to adjusting of the threshold voltage of the select gates at higher temperatures. For example, programming the threshold voltage of select gates at lower temperatures can result in a wider distribution of threshold voltages, including a possible upper tail in the threshold voltage distribution for the select gates, as compared to programming the threshold voltage of select gates at higher temperatures. Additionally, programming the threshold voltage of select gates at lower temperatures will usually take longer than programming the threshold voltage of select gates at higher temperatures. Therefore, it is proposed to perform the programming of the threshold voltage of select gates as a function of temperature. For purposes of this document, "programming" a select gate means to adjust its threshold voltage or other property that defines when/how it switches. Similarly, a select gate is "programmable" if its threshold voltage (or other property that defines when/how it switches) can be adjusted. Thus, a programmable select gate can have a non-volatile property of the select gate adjusted. For a transistor, the threshold voltage is an example of a non-volatile property. Other switches can have other non-volatile properties.

One embodiment of the proposed technology for programming the threshold voltage of select gates as a function of temperature includes a memory system comprising a plurality of non-volatile memory cells arranged in groups of memory cells and one or more control circuits in communication with the plurality of non-volatile memory cells. Each group of memory cells comprises data memory cells and one or more select gates. The select gates are programmable. The one or more control circuits are electrical circuits that program a select gate identified to be programmed if a temperature at the non-volatile memory cells is greater than a minimum temperature and defer programming of the select gate identified to be programmed if the temperature at the non-volatile memory cells is not greater than the minimum temperature. The one or more control circuits can be hardware only or hardware in combination with software. More details are provided below.

FIG. 1A is a block diagram of one embodiment of a memory system 100 connected to a host 120. Memory system 100 can implement the technology proposed herein. Many different types of memory systems can be used with the technology proposed herein. One example memory system is a solid state drive ("SSD"); however, other types of memory systems can also be used. Memory system 100 comprises a Controller 102, non-volatile memory 104 for storing data, and local memory (e.g. DRAM/ReRAM) 106. Controller 102 comprises a Front End Processor Circuit (FEP) 110 and one or more Back End Processor Circuits (BEP) 112. In one embodiment FEP110 circuit is implemented on an ASIC. In one embodiment, each BEP circuit 112 is implemented on a separate ASIC. The ASICs for each of the BEP circuits 112 and the FEP circuit 110 are implemented on the same semiconductor such that the Controller 102 is manufactured as a System on a Chip ("SoC"). FEP 110 and BEP 112 both include their own processors. In one embodiment, FEP110 and BEP 112 work as a master slave configuration where the FEP110 is the master and each BEP 112 is a slave. For example, FEP circuit 110 implements a flash translation layer that performs memory management (e.g., garbage collection, wear leveling, etc.), logical to physical address translation, communication with the host, management of DRAM (local volatile memory) and management of the overall operation of the SSD (or other non-volatile storage system). The BEP circuit 112 manages memory operations in the memory packages/die at the request of FEP circuit 110. For example, the BEP circuit 112 can carry out the read, erase and programming processes. Additionally, the BEP circuit 112 can perform buffer management, set specific voltage levels required by the FEP circuit 110, perform error correction (ECC), control the Toggle Mode interfaces to the memory packages, etc. In one embodiment, each BEP circuit 112 is responsible for its own set of memory packages. Controller 102 is one example of a control circuit.

In one embodiment, non-volatile memory 104 comprises a plurality of memory packages. Each memory package includes one or more memory die. Therefore, Controller 102 is connected to one or more non-volatile memory die. In one embodiment, each memory die in the memory packages 14 utilize NAND flash memory (including two dimensional NAND flash memory and/or three dimensional NAND flash memory). In other embodiments, the memory package can include other types of memory.

Controller 102 communicates with host 120 via an interface 130 that implements NVM Express (NVMe) over PCI Express (PCIe). For working with memory system 100, host 120 includes a host processor 122, host memory 124, and a PCIe interface 126. Host memory 124 is the host's physical memory, and can be DRAM, SRAM, non-volatile memory or another type of storage. Host 120 is external to and separate from memory system 100. In one embodiment, memory system 100 is embedded in host 120.

Figure 1B:
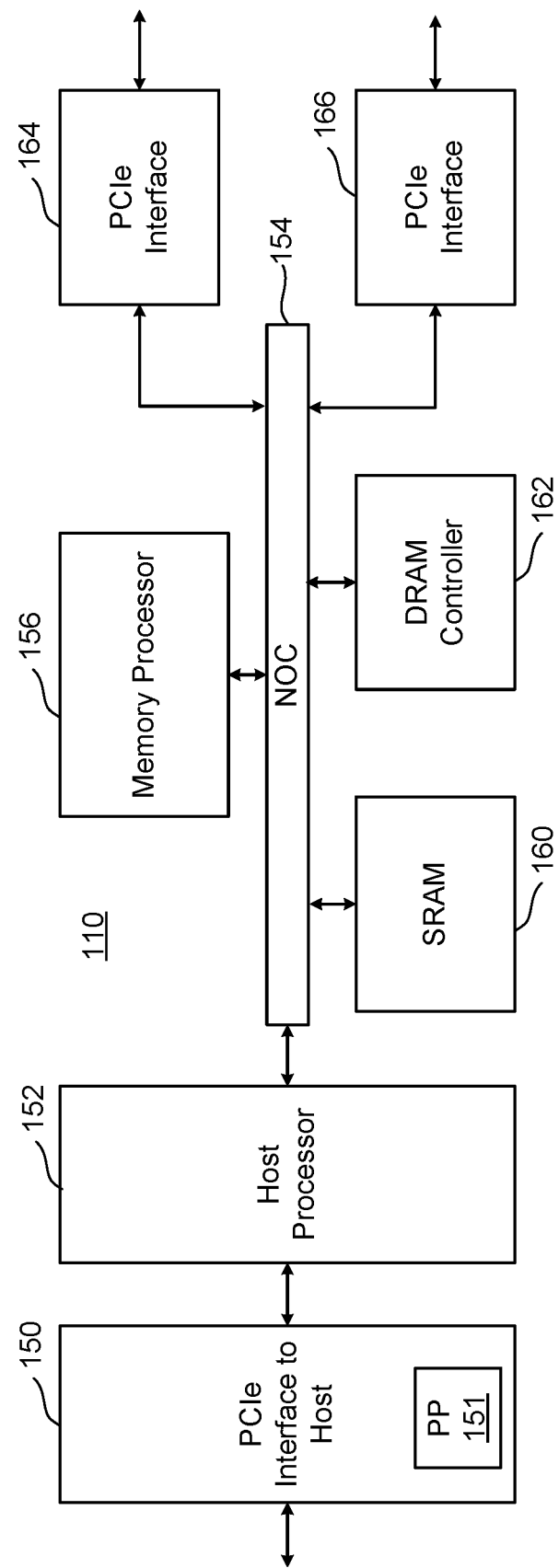
FIG. 1B is a block diagram of one embodiment of a Front End Processor Circuit. In some embodiments, the Front End Processor Circuit is part of a Controller.

FIG. 1B is a block diagram of one embodiment of FEP circuit 110. FIG. 1B shows a PCIe interface 150 to communicate with host 120 and a host processor 152 in communication with that PCIe interface. The host processor 152 can be any type of processor known in the art that is suitable for the implementation. Host processor 152 is in communication with a network-on-chip (NOC) 154. A NOC is a communication subsystem on an integrated circuit, typically between cores in a SoC. NOC's can span synchronous and asynchronous clock domains or use unclocked asynchronous logic. NOC technology applies networking theory and methods to on-chip communications and brings notable improvements over conventional bus and crossbar interconnections. NOC improves the scalability of SoCs and the power efficiency of complex SoCs compared to other designs. The wires and the links of the NOC are shared by many signals. A high level of parallelism is achieved because all links in the NOC can operate simultaneously on different data packets. Therefore, as the complexity of integrated subsystems keep growing, a NOC provides enhanced performance (such as throughput) and scalability in comparison with previous communication architectures (e.g., dedicated point-to-point signal wires, shared buses, or segmented buses with bridges). Connected to and in communication with NOC 154 is the memory processor 156, SRAM 160 and a DRAM controller 162. The DRAM controller 162 is used to operate and communicate with the DRAM (e.g., DRAM 106). SRAM 160 is local RAM memory used by memory processor 156. Memory processor 156 is used to run the FEP circuit and perform the various memory operations. Also in communication with the NOC are two PCIe Interfaces 164 and 166. In the embodiment of FIG. 1B, the SSD controller will include two BEP circuits 112; therefore there are two PCIe Interfaces 164/166. Each PCIe Interface communicates with one of the BEP circuits 112. In other embodiments, there can be more or less than two BEP circuits 112; therefore, there can be more than two PCIe Interfaces.

Figure 1C:
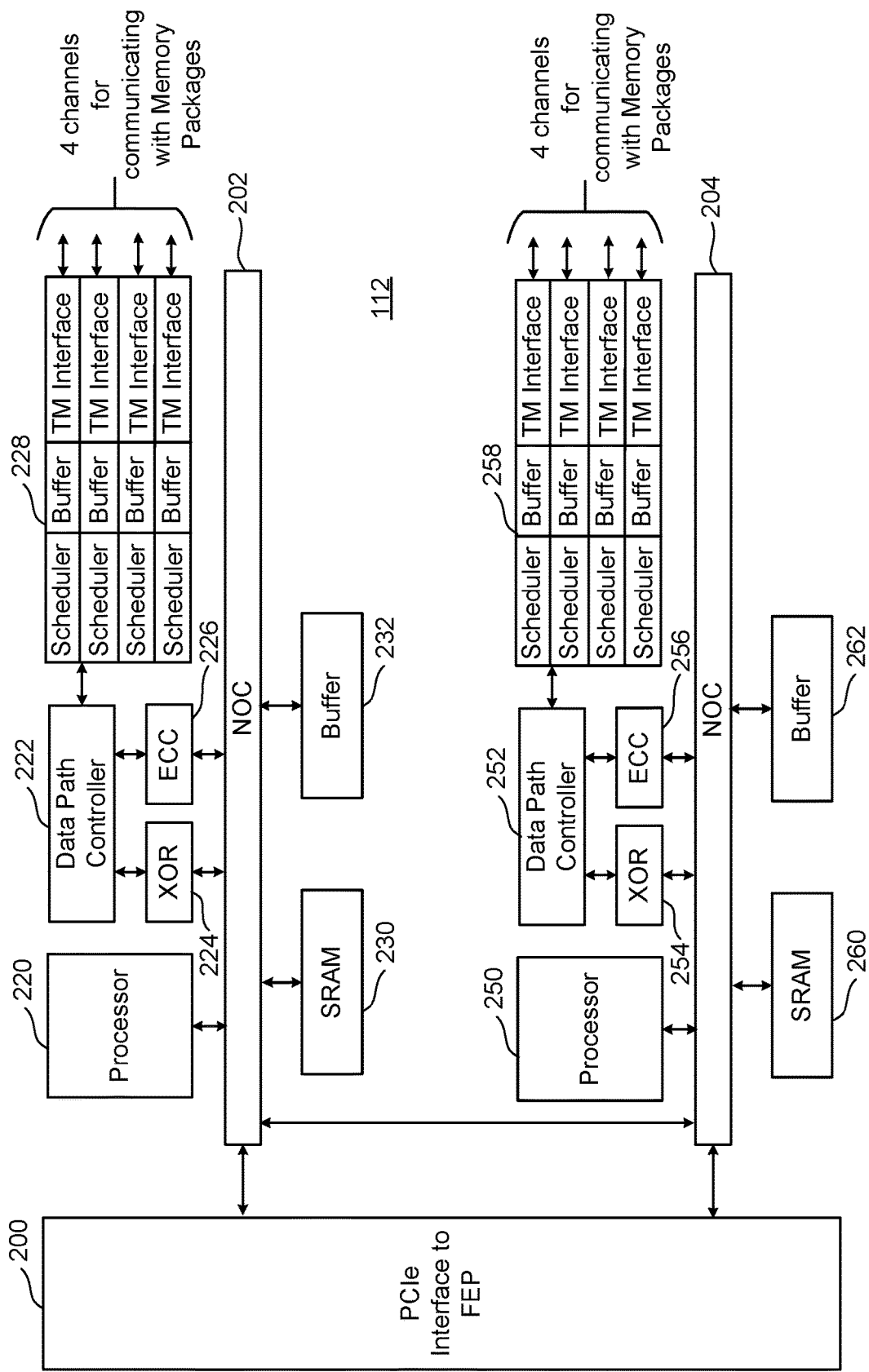
FIG. 1C is a block diagram of one embodiment of a Back End Processor Circuit. In some embodiments, the Back End Processor Circuit is part of a Controller.

FIG. 1C is a block diagram of one embodiment of the BEP circuit 112. FIG. 1C shows a PCIe Interface 200 for communicating with the FEP circuit 110 (e.g., communicating with one of PCIe Interfaces 164 and 166 of FIG. 2). PCIe Interface 200 is in communication with two NOCs 202 and 204. In one embodiment the two NOCs can be combined to one large NOC. Each NOC (202/204) is connected to SRAM (230/260), a buffer (232/262), processor (220/250), and a data path controller (222/252) via an XOR engine (224/254) and an ECC engine (226/256). The ECC engines 226/256 are used to perform error correction, as known in the art. The XOR engines 224/254 are used to XOR the data so that data can be combined and stored in a manner that can be recovered in case there is a programming error. Data path controller 22 is connected to an interface module for communicating via four channels with memory packages. Thus, the top NOC 202 is associated with an interface 228 for four channels for communicating with memory packages and the bottom NOC 204 is associated with an interface 258 for four additional channels for communicating with memory packages. Each interface 228/258 includes four Toggle Mode interfaces (TM Interface), four buffers and four schedulers. There is one scheduler, buffer and TM Interface for each of the channels. The processor can be any standard processor known in the art. The data path controllers 222/252 can be a processor, FPGA, microprocessor or other type of controller. The XOR engines 224/254 and ECC engines 226/256 are dedicated hardware circuits, known as hardware accelerators. In other embodiments, the XOR engines 224/254 and ECC engines 226/256 can be implemented in software. The scheduler, buffer, and TM Interfaces are hardware circuits.

Figure 1D:
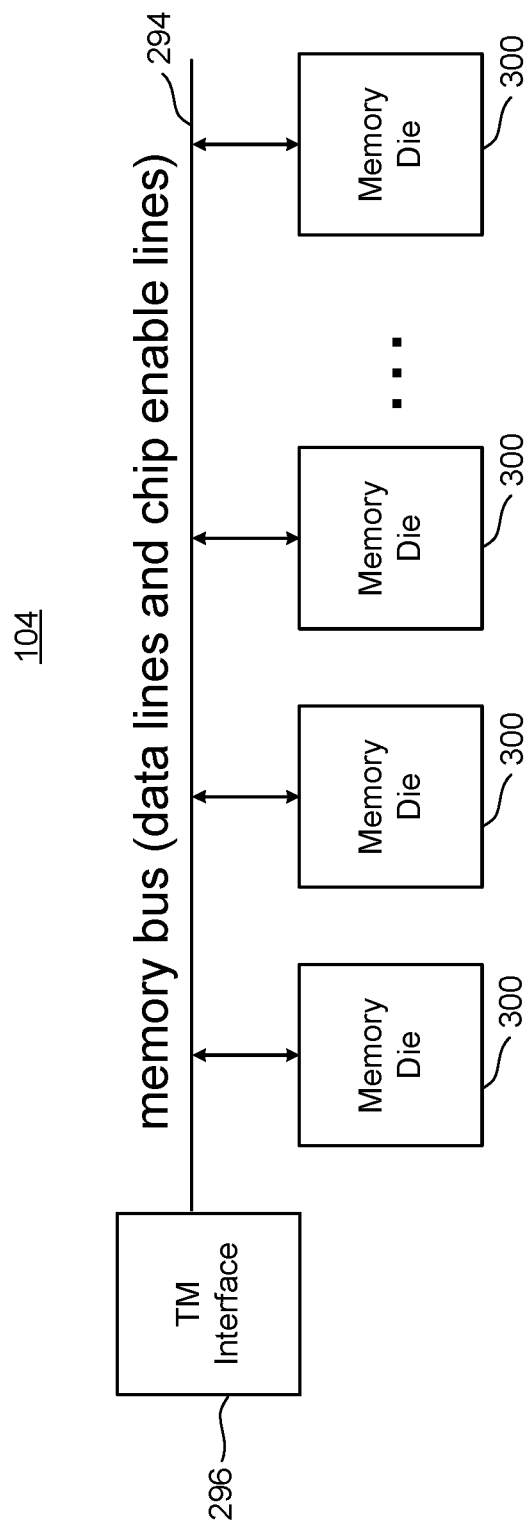
FIG. 1D is a block diagram of one embodiment of a memory package.

FIG. 1D is a block diagram of one embodiment of a memory package 104 that includes a plurality of memory die 300 connected to a memory bus (data lines and chip enable lines) 294. The memory bus 294 connects to a Toggle Mode Interface 296 for communicating with the TM Interface of a BEP circuit 112 (see e.g. FIG. 1C). In some embodiments, the memory package can include a small controller connected to the memory bus and the TM Interface. The memory package can have one or more memory die. In one embodiment, each memory package includes eight or 16 memory die; however, other numbers of memory die can also be implemented. The technology described herein is not limited to any particular number of memory die.

FIG. 2 is a functional block diagram of one embodiment of a memory die 300. Each of the one or more memory die 130 of FIG. 1D can be implemented as memory die 300 of FIG. 2. The components depicted in FIG. 2 are electrical circuits. In one embodiment, each memory die 300 includes a memory structure 326, control circuitry 310, and read/write circuits 328, all of which are electrical circuits. Memory structure 326 is addressable by word lines via a row decoder 324 and by bit lines via a column decoder 332. The read/write circuits 328 include multiple sense blocks 350 including SB1, SB2, . . . , SBp (sensing circuitry) and allow a page (or multiple pages) of data in multiple memory cells to be read or programmed in parallel. In one embodiment, each sense block include a sense amplifier and a set of latches connected to the bit line. The latches store data to be written and/or data that has been read. The sense blocks include bit line drivers.

Commands and data are transferred between the controller and the memory die 300 via lines 318. In one embodiment, memory die 300 includes a set of input and/or output (I/O) pins that connect to lines 118.

Control circuitry 310 cooperates with the read/write circuits 328 to perform memory operations (e.g., write, read, erase, and others) on memory structure 326. In one embodiment, control circuitry 310 includes a state machine 312, an on-chip address decoder 314, a power control circuit 316 and a temperature detection circuit 318. State machine 312 provides die-level control of memory operations. In one embodiment, state machine 312 is programmable by software. In other embodiments, state machine 312 does not use software and is completely implemented in hardware (e.g., electrical circuits). In some embodiments, state machine 312 can be replaced by a microcontroller or microprocessor. In one embodiment, control circuitry 310 includes buffers such as registers, ROM fuses and other storage devices for storing default values such as base voltages and other parameters.

The on-chip address decoder 314 provides an address interface between addresses used by controller 120 to the hardware address used by the decoders 324 and 332. Power control module 316 controls the power and voltages supplied to the word lines and bit lines during memory operations. Power control module 316 may include charge pumps for creating voltages.

For purposes of this document, control circuitry 310, alone or in combination with read/write circuits 328 and decoders 324/332, comprise one or more control circuits for memory structure 326. These one or more control circuits are electrical circuits that perform the functions described below in the flow charts and signal diagrams. In other embodiments, the one or more control circuits can consist only of controller 102, which is an electrical circuit in combination with software, that performs the functions described below in the flow charts and signal diagrams. In another alternative, the one or more control circuits comprise controller 102 and control circuitry 310 performing the functions described below in the flow charts and signal diagrams. In another embodiment, the one or more control circuits comprise state machine 312 (or a microcontroller or microprocessor) alone or in combination with controller 102.

In one embodiment, memory structure 326 comprises a monolithic three dimensional memory array of non-volatile memory cells in which multiple memory levels are formed above a single substrate, such as a wafer. The memory structure may comprise any type of non-volatile memory that is monolithically formed in one or more physical levels of arrays of memory cells having an active area disposed above a silicon (or other type of) substrate. In one example, the non-volatile memory cells of memory structure 326 comprise vertical NAND strings with charge-trapping material such as described, for example, in U.S. Pat. No. 9,721,662, incorporated herein by reference in its entirety. In another embodiment, memory structure 326 comprises a two dimensional memory array of non-volatile memory cells. In one example, the non-volatile memory cells are NAND flash memory cells utilizing floating gates such as described, for example, in U.S. Pat. No. 9,082,502, incorporated herein by reference in its entirety. Other types of memory cells (e.g., NOR-type flash memory) can also be used.

The exact type of memory array architecture or memory cell included in memory structure 326 is not limited to the examples above. Many different types of memory array architectures or memory cell technologies can be used to form memory structure 326. No particular non-volatile memory technology is required for purposes of the new claimed embodiments proposed herein. Other examples of suitable technologies for memory cells of the memory structure 326 include ReRAM memories, magnetoresistive memory (e.g., MRAM, Spin Transfer Torque MRAM, Spin Orbit Torque MRAM), phase change memory (e.g., PCM), and the like. Examples of suitable technologies for architectures of memory structure 126 include two dimensional arrays, three dimensional arrays, cross-point arrays, stacked two dimensional arrays, vertical bit line arrays, and the like.

One example of a ReRAM, or PCMRAM, cross point memory includes reversible resistance-switching elements arranged in cross point arrays accessed by X lines and Y lines (e.g., word lines and bit lines). In another embodiment, the memory cells may include conductive bridge memory elements. A conductive bridge memory element may also be referred to as a programmable metallization cell. A conductive bridge memory element may be used as a state change element based on the physical relocation of ions within a solid electrolyte. In some cases, a conductive bridge memory element may include two solid metal electrodes, one relatively inert (e.g., tungsten) and the other electrochemically active (e.g., silver or copper), with a thin film of the solid electrolyte between the two electrodes. As temperature increases, the mobility of the ions also increases causing the programming threshold for the conductive bridge memory cell to decrease. Thus, the conductive bridge memory element may have a wide range of programming thresholds over temperature.

Magnetoresistive memory (MRAM) stores data by magnetic storage elements. The elements are formed from two ferromagnetic plates, each of which can hold a magnetization, separated by a thin insulating layer. One of the two plates is a permanent magnet set to a particular polarity; the other plate's magnetization can be changed to match that of an external field to store memory. A memory device is built from a grid of such memory cells. In one embodiment for programming, each memory cell lies between a pair of write lines arranged at right angles to each other, parallel to the cell, one above and one below the cell. When current is passed through them, an induced magnetic field is created.

Phase change memory (PCM) exploits the unique behavior of chalcogenide glass. One embodiment uses a GeTe—Sb2Te3 super lattice to achieve non-thermal phase changes by simply changing the co-ordination state of the Germanium atoms with a laser pulse (or light pulse from another source). Therefore, the doses of programming are laser pulses. The memory cells can be inhibited by blocking the memory cells from receiving the light. Note that the use of "pulse" in this document does not require a square pulse, but includes a (continuous or non-continuous) vibration or burst of sound, current, voltage light, or other wave.

A person of ordinary skill in the art will recognize that the technology described herein is not limited to a single specific memory structure, but covers many relevant memory structures within the spirit and scope of the technology as described herein and as understood by one of ordinary skill in the art.

Figure 3:
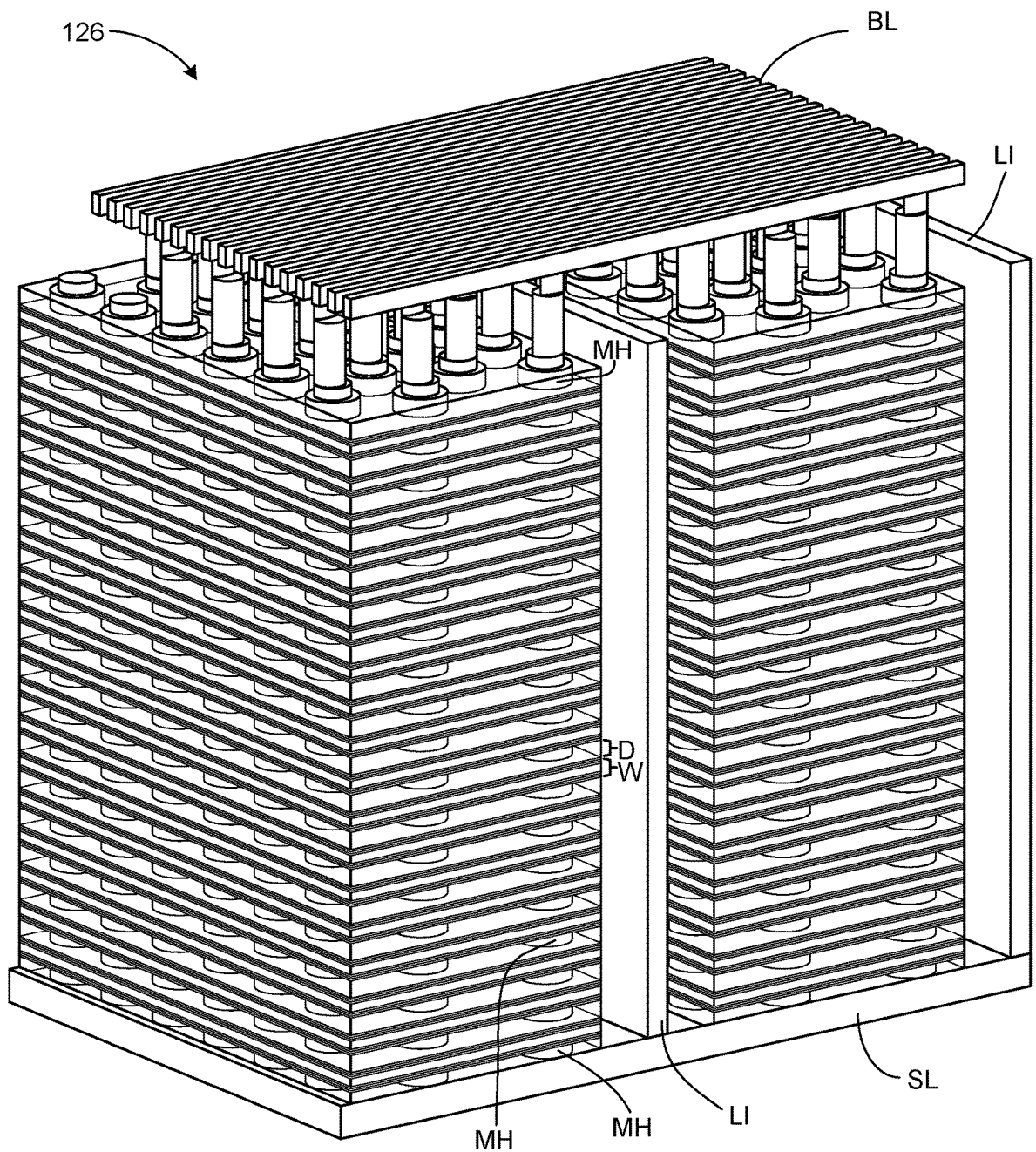
FIG. 3 is a perspective view of a portion of one embodiment of a monolithic three dimensional memory structure.

FIG. 3 is a perspective view of a portion of one example embodiment of a monolithic three dimensional memory array that can comprise memory structure 126, which includes a plurality memory cells. For example, FIG. 3 shows a portion of one block of memory. The structure depicted includes a set of bit lines BL positioned above a stack of alternating dielectric layers and conductive layers. For example purposes, one of the dielectric layers is marked as D and one of the conductive layers (also called word line layers) is marked as W. The number of alternating dielectric layers and conductive layers can vary based on specific implementation requirements. One set of embodiments includes between 108-278 alternating dielectric layers and conductive layers, for example, 127 data word line layers, 8 select layers, 4 dummy word line layers and 139 dielectric layers. More or less than 108-278 layers can also be used. As will be explained below, the alternating dielectric layers and conductive layers are divided into four "fingers" by local interconnects LI. FIG. 3 shows two fingers and two local interconnects LI. Below and the alternating dielectric layers and word line layers is a source line layer SL. Memory holes are formed in the stack of alternating dielectric layers and conductive layers. For example, one of the memory holes is marked as MH. Note that in FIG. 3, the dielectric layers are depicted as see-through so that the reader can see the memory holes positioned in the stack of alternating dielectric layers and conductive layers. In one embodiment, NAND strings are formed by filling the memory hole with materials including a charge-trapping layer to create a vertical column of memory cells. Each memory cell can store one or more bits of data. More details of the three dimensional monolithic memory array that comprises memory structure 126 is provided below with respect to FIGS. 4A-4F.

Figure 4A:
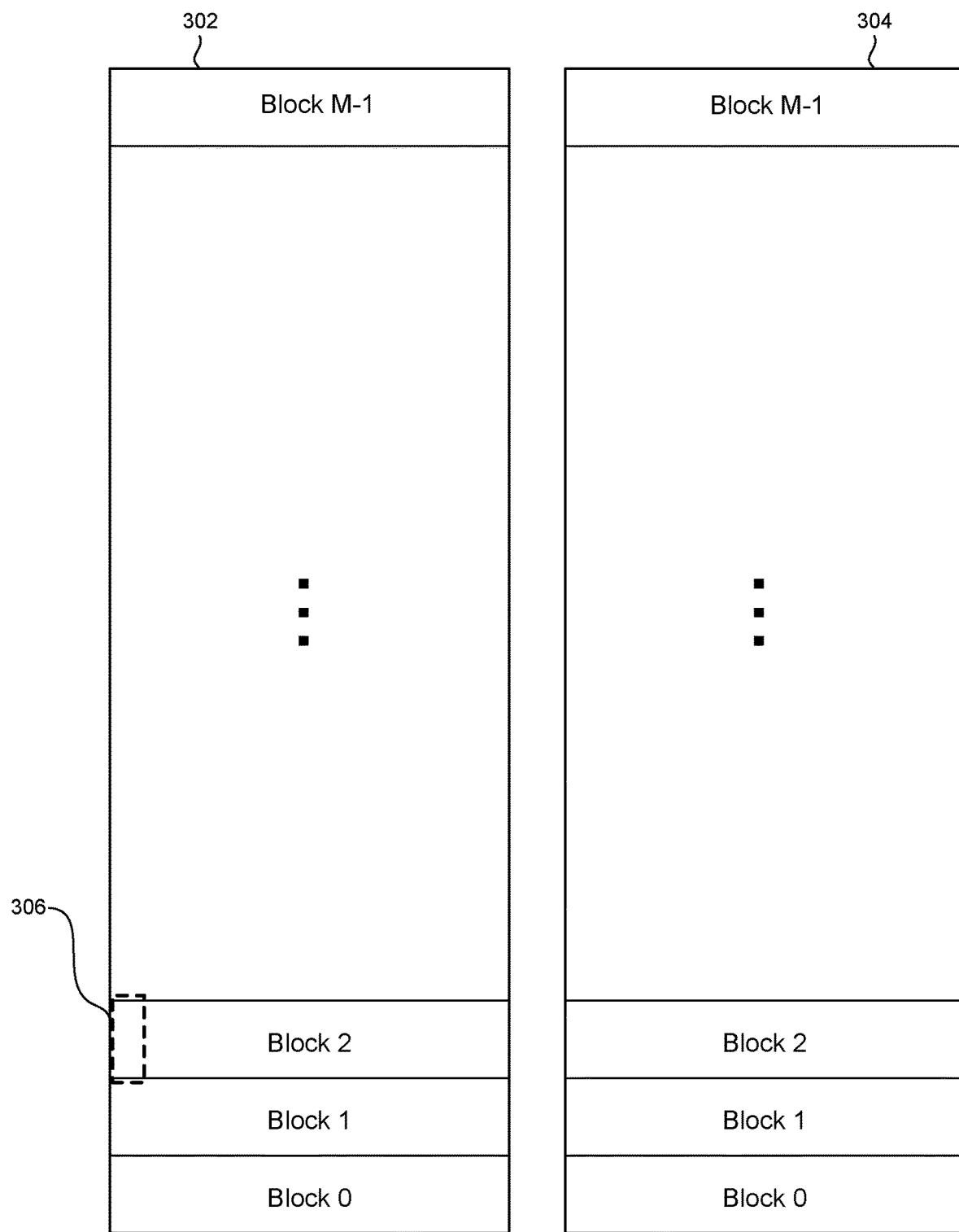
FIG. 4A is a block diagram of a memory structure having two planes.

FIG. 4A is a block diagram explaining one example organization of memory structure 326, which is divided into two planes 302 and 304. Each plane is then divided into M blocks. In one example, each plane has about 2000 blocks. However, different numbers of blocks and planes can also be used. In on embodiment, a block of memory cells is a unit of erase. That is, all memory cells of a block are erased together. In other embodiments, memory cells can be grouped into blocks for other reasons, such as to organize the memory structure 126 to enable the signaling and selection circuits. In some embodiments, a block represents a groups of connected memory cells as the memory cells of a block share a common set of word lines.

Figure 4B:
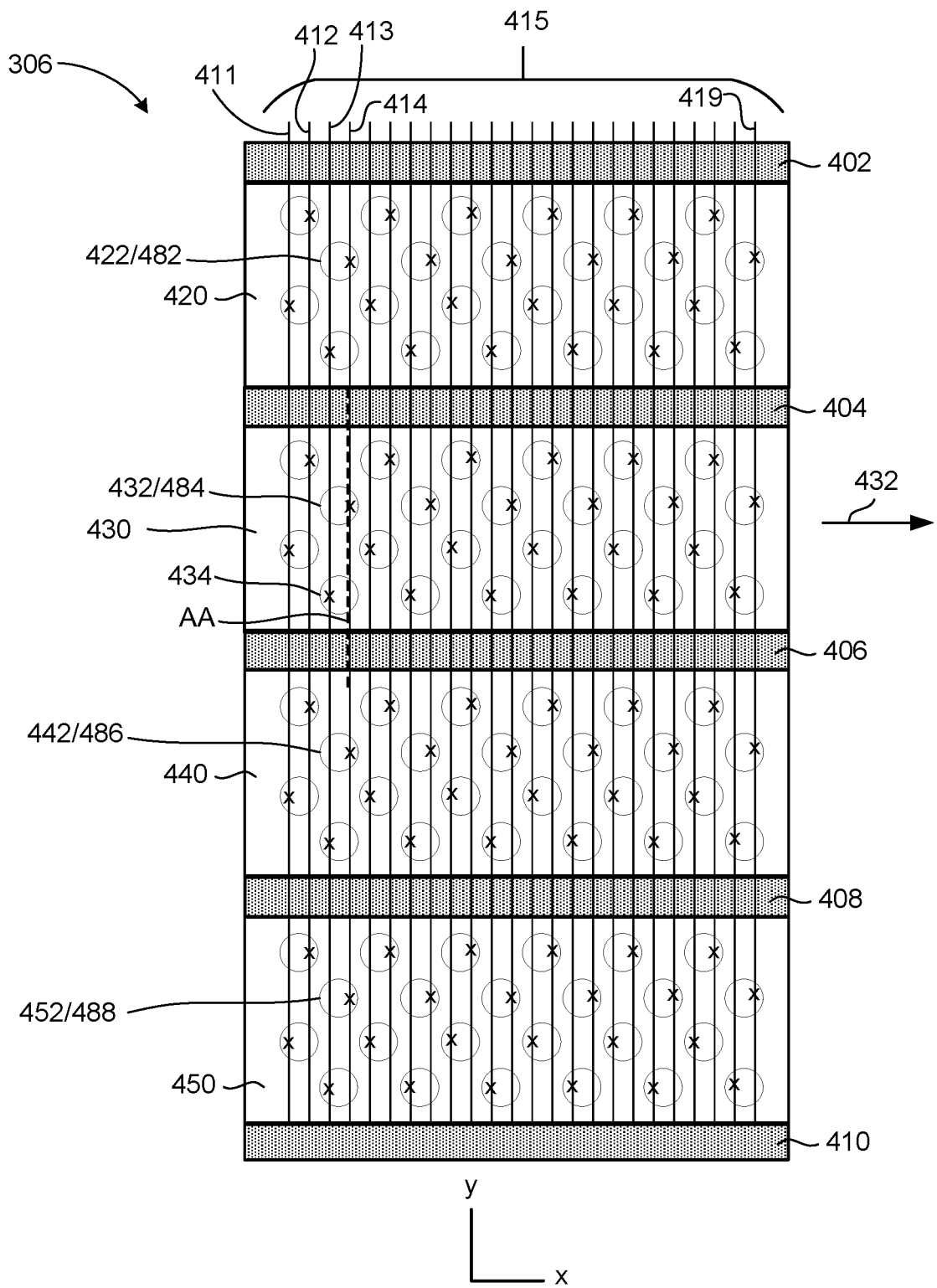
FIG. 4B depicts a top view of a portion of a block of memory cells.

FIGS. 4B-4F depict an example three dimensional ("3D") NAND structure. FIG. 4B is a block diagram depicting a top view of a portion of one block from memory structure 326. The portion of the block depicted in FIG. 4B corresponds to portion 306 in block 2 of FIG. 4A. As can be seen from FIG. 4B, the block depicted in FIG. 4B extends in the direction of 432. In one embodiment, the memory array has sixty layers. Other embodiments have less than or more than sixty layers. However, FIG. 4B only shows the top layer.

FIG. 4B depicts a plurality of circles that represent the vertical columns. Each of the vertical columns include multiple select gates (also referred to as a select transistors) and multiple memory cells (also referred to as data memory cells). In one embodiment, each vertical column implements a NAND string. For example, FIG. 4B depicts vertical columns 422, 432, 442 and 452. Vertical column 422 implements NAND string 482. Vertical column 432 implements NAND string 484. Vertical column 442 implements NAND string 486. Vertical column 452 implements NAND string 488. More details of the vertical columns are provided below. Since the block depicted in FIG. 4B extends in the direction of arrow 432, the block includes more vertical columns than depicted in FIG. 4B FIG. 4B also depicts a set of bit lines 415, including bit lines 411, 412, 413, 414, . . . 419. FIG. 4B shows twenty four bit lines because only a portion of the block is depicted. It is contemplated that more than twenty four bit lines connected to vertical columns of the block. Each of the circles representing vertical columns has an "x" to indicate its connection to one bit line. For example, bit line 414 is connected to vertical columns 422, 432, 442 and 452.

The block depicted in FIG. 4B includes a set of local interconnects 402, 404, 406, 408 and 410 that connect the various layers to a source line below the vertical columns. Local interconnects 402, 404, 406, 408 and 410 also serve to divide each layer of the block into four regions; for example, the top layer depicted in FIG. 4B is divided into regions 420, 430, 440 and 450, which are referred to as fingers. In the layers of the block that implement memory cells, the four regions are referred to as word line fingers that are separated by the local interconnects. In one embodiment, the word line fingers on a common level of a block connect together at the end of the block to form a single word line. In another embodiment, the word line fingers on the same level are not connected together. In one example implementation, a bit line only connects to one vertical column in each of regions 420, 430, 440 and 450. In that implementation, each block has sixteen rows of active columns and each bit line connects to four rows in each block. In one embodiment, all of four rows connected to a common bit line are connected to the same word line (via different word line fingers on the same level that are connected together); therefore, the system uses the source side selection lines and the drain side selection lines to choose one (or another subset) of the four to be subjected to a memory operation (program, verify, read, and/or erase).

Although FIG. 4B shows each region having four rows of vertical columns, four regions and sixteen rows of vertical columns in a block, those exact numbers are an example implementation. Other embodiments may include more or less regions per block, more or less rows of vertical columns per region and more or less rows of vertical columns per block.

FIG. 4B also shows the vertical columns being staggered. In other embodiments, different patterns of staggering can be used. In some embodiments, the vertical columns are not staggered.

Figure 4C:
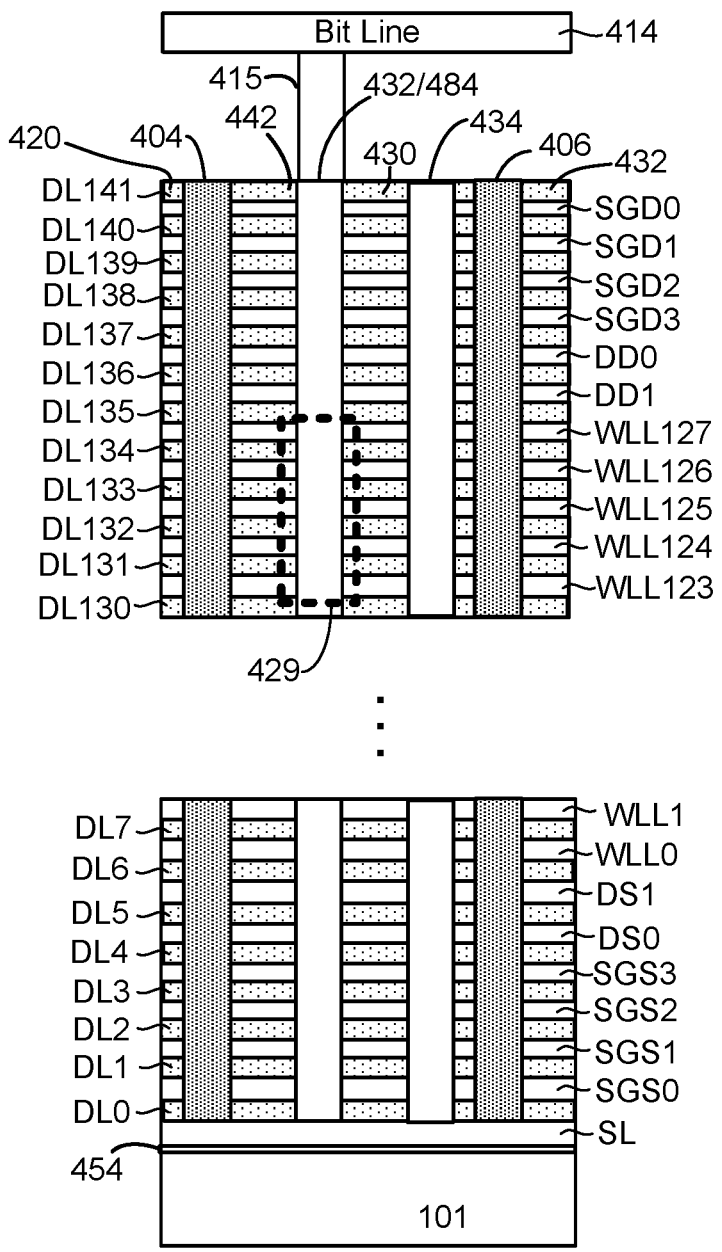
FIG. 4C depicts a cross sectional view of a portion of a block of memory cells.

FIG. 4C depicts a portion of one embodiment of a three dimensional memory structure 326 showing a cross-sectional view along line AA of FIG. 4B. This cross sectional view cuts through vertical columns 432 and 434 and region 430 (see FIG. 4B). The structure of FIG. 4C includes four drain side select layers SGD0, SGD1, SGD2 and SGD3 associated with the drain side select gates; four source side select layers SGS0, SGS1, SGS2 and SGS3 associated with the source side select gates; four dummy word line layers DD0, DD1, DS0 and DS1; and forty eight data word line layers WLL0-WLL127 for connecting to data memory cells. Other embodiments can implement more or less than four drain side select layers, more or less than four source side select layers, more or less than four dummy word line layers, and more or less than one hundred and twenty eight word line. Vertical columns 432 and 434 are depicted protruding through the drain side select layers, source side select layers, dummy word line layers and word line layers. In one embodiment, each vertical column comprises a NAND string. For example, vertical column 432 comprises NAND string 484. Below the vertical columns and the layers listed below is substrate 101, an insulating film 454 on the substrate, and source line SL. The NAND string of vertical column 432 has a source end at a bottom of the stack and a drain end at a top of the stack. As in agreement with FIG. 4B, FIG. 4C show vertical column 432 connected to Bit Line 414 via connector 415. Local interconnects 404 and 406 are also depicted.

For ease of reference, drain side select layers SGD0, SGD1, SGD2 and SGD3; source side select layers SGS0, SGS1, SGS2 and SGS3; dummy word line layers DD0, DD1, DS0 and DS1; and word line layers WLL0-WLL127 collectively are referred to as the conductive layers. In one embodiment, the conductive layers are made from a combination of TiN and Tungsten. In other embodiments, other materials can be used to form the conductive layers, such as doped polysilicon, metal such as Tungsten or metal silicide. In some embodiments, different conductive layers can be formed from different materials. Between conductive layers are dielectric layers DL0-DL141. For example, dielectric layers DL131 is above word line layer WLL123 and below word line layer WLL124. In one embodiment, the dielectric layers are made from $SiO_2$. In other embodiments, other dielectric materials can be used to form the dielectric layers.

The non-volatile memory cells are formed along vertical columns which extend through alternating conductive and dielectric layers in the stack. In one embodiment, the memory cells are arranged in NAND strings. The word line layers WLL0-WLL127 connect to memory cells (also called data memory cells). Dummy word line layers DD0, DD1, DS0 and DS1 connect to dummy memory cells. A dummy memory cell does not store host data (data provided from the host, such as data from a user of the host), while a data memory cell is eligible to store host data. Drain side select layers SGD0, SGD1, SGD2 and SGD3 are used to electrically connect and disconnect NAND strings from bit lines. Source side select layers SGS0, SGS1, SGS2 and SGS3 are used to electrically connect and disconnect NAND strings from the source line SL.

FIG. 4D depicts a logical representation of the conductive layers (SGD0, SGD1, SGD2, SGD3, SGS0, SGS1, SGS2, SGS3, DD0, DD1, DS0, DS1, and WLL0-WLL127) for the block that is partially depicted in FIG. 4C. As mentioned above with respect to FIG. 4B, in one embodiment local interconnects 402, 404, 406, 408 and 410 break up the conductive layers into four regions/fingers (or sub-blocks). For example, word line layer WLL126 is divided into regions 460, 462, 464 and 466. For word line layers (WLL0-WLL127), the regions are referred to as word line fingers; for example, word line layer WLL126 is divided into word line fingers 460, 462, 464 and 466. For example, region 460 is one word line finger on one word line layer. In one embodiment, the four word line fingers on a same level are connected together. In another embodiment, each word line finger operates as a separate word line.

Drain side select gate layer SGD0 (the top layer) is also divided into regions 420, 430, 440 and 450, also known as fingers or select line fingers. In one embodiment, the four select line fingers on a same level are connected together. In another embodiment, each select line finger operates as a separate word line.

Figure 4E:
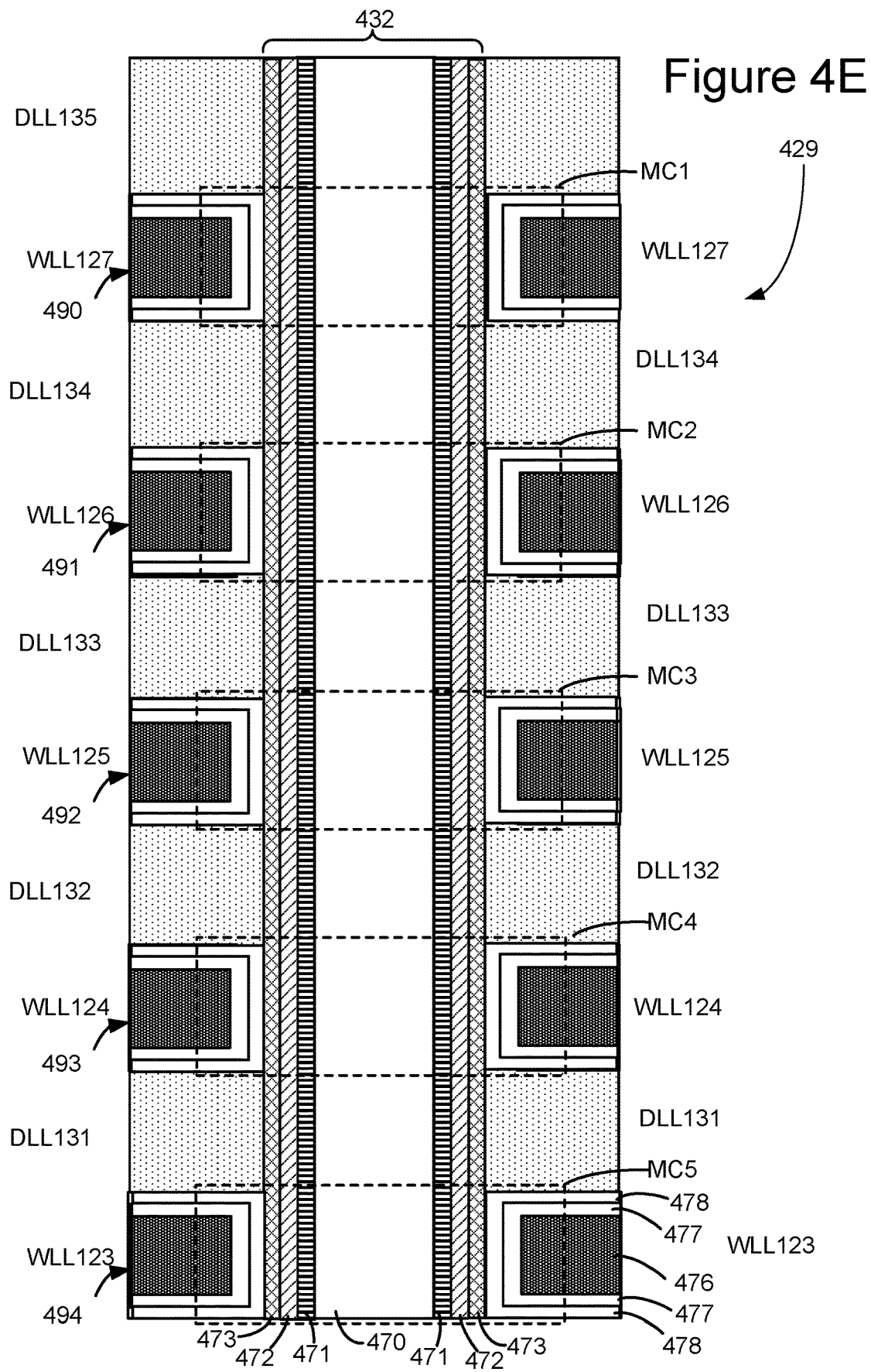
FIG. 4E is a cross sectional view of a vertical column of memory cells.

FIG. 4E depicts a cross sectional view of region 429 of FIG. 4C that includes a portion of vertical column 432. In one embodiment, the vertical columns are round; however, in other embodiments other shapes can be used. In one embodiment, vertical column 432 includes an inner core layer 470 that is made of a dielectric, such as $SiO_2$. Other materials can also be used. Surrounding inner core 470 is polysilicon channel 471. Materials other than polysilicon can also be used. Note that it is the channel 471 that connects to the bit line and the source line. Surrounding channel 471 is a tunneling dielectric 472. In one embodiment, tunneling dielectric 472 has an ONO structure. Surrounding tunneling dielectric 472 is charge trapping layer 473, such as (for example) Silicon Nitride. Other memory materials and structures can also be used. The technology described herein is not limited to any particular material or structure.

FIG. 4E depicts dielectric layers DLL131, DLL132, DLL133, DLL134 and DLL135, as well as word line layers WLL123, WLL124, WLL125, WLL126, and WLL127. Each of the word line layers includes a word line region 476 surrounded by an aluminum oxide layer 477, which is surrounded by a blocking oxide ($SiO_2$) layer 478. The physical interaction of the word line layers with the vertical column forms the memory cells. Thus, a memory cell, in one embodiment, comprises channel 471, tunneling dielectric 472, charge trapping layer 473, blocking oxide layer 478, aluminum oxide layer 477 and word line region 476. For example, word line layer WLL127 and a portion of vertical column 432 comprise a memory cell MC1. Word line layer WLL126 and a portion of vertical column 432 comprise a memory cell MC2. Word line layer WLL125 and a portion of vertical column 432 comprise a memory cell MC3. Word line layer WLL124 and a portion of vertical column 432 comprise a memory cell MC4. Word line layer WLL123 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Figure 4F:
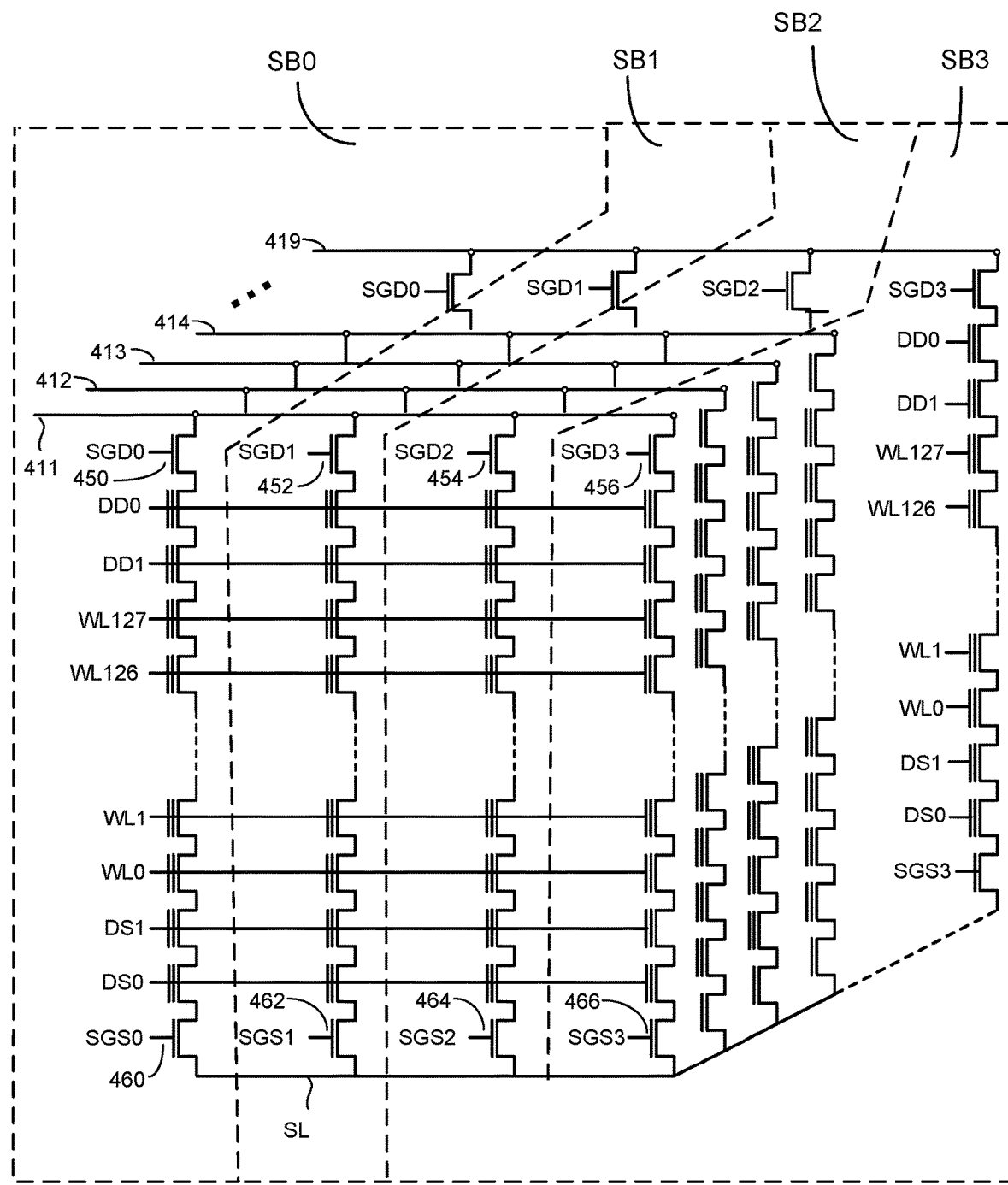
FIG. 4F is a schematic of a plurality of NAND strings.

FIG. 4F is a schematic diagram of a portion of the memory depicted in in FIGS. 3-4E. FIG. 4F shows physical word lines WLL0-WLL127 running across the entire block. The structure of FIG. 4F corresponds to portion 306 in Block 2 of FIGS. 4A-E, including bit lines 411, 412, 413, 414, . . . 419. Within the block, each bit line is connected to four NAND strings. Drain side selection lines SGD0, SGD1, SGD2 and SGD3 are used to determine which of the four NAND strings connect to the associated bit line(s). The transistors 450, 452, 454, 456 connected to the drain side selection lines SGD0, SGD1, SGD2 and SGD3 are drain side select gates. Source side selection lines SGS0, SGS1, SGS2 and SGS3 are used to determine which of the four NAND strings connect to the common source line. The transistors 460, 462, 464, 466 connected to the source side selection lines SGS0, SGS1, SGS2 and SGS3 are source side select gates. The block can also be thought of as divided into four sub-blocks SB0, SB1, SB2 and SB3. Sub-block SB0 corresponds to those vertical NAND strings controlled by SGD0 and SGS0, sub-block SB1 corresponds to those vertical NAND strings controlled by SGD1 and SGS1, sub-block SB2 corresponds to those vertical NAND strings controlled by SGD2 and SGS2, and sub-block SB3 corresponds to those vertical NAND strings controlled by SGD3 and SGS3.

Although the example memory system of FIGS. 3-4F is a three dimensional memory structure that includes vertical NAND strings with charge-trapping material, other (2D and 3D) memory structures can also be used with the technology described herein.

Figures 5, 6:
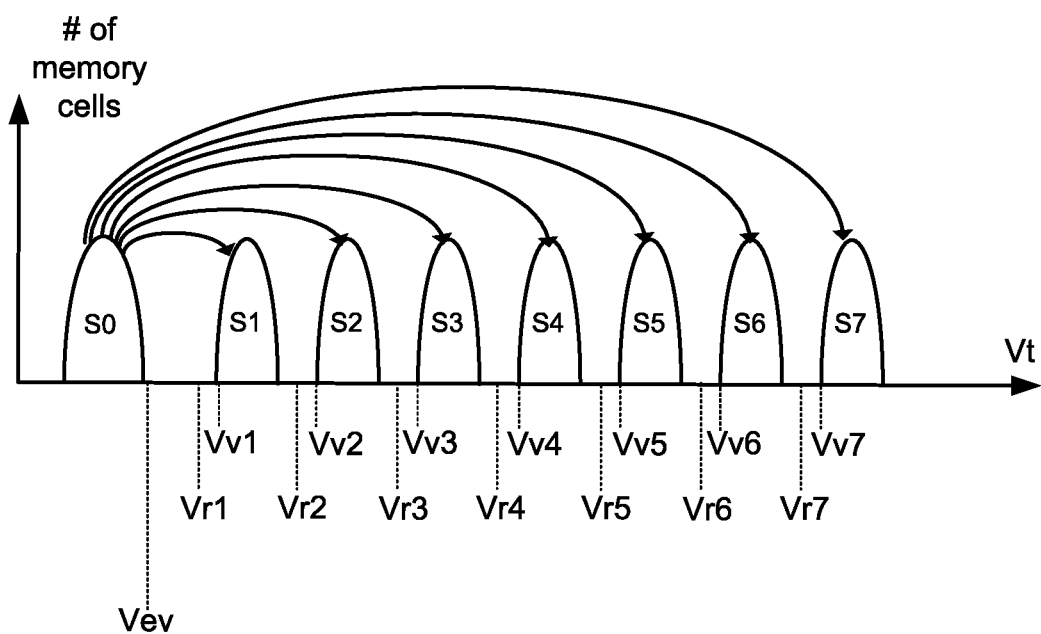
FIG. 5 depicts threshold voltage distributions.
FIG. 6 is a table describing one example of an assignment of data values to data states.

The memory systems discussed above can be erased, programmed and read. At the end of a successful programming process (with verification), the threshold voltages of the memory cells should be within one or more distributions of threshold voltages for programmed memory cells or within a distribution of threshold voltages for erased memory cells, as appropriate. FIG. 5 illustrates example threshold voltage distributions for the memory array when each memory cell stores three bits of data. Other embodiments, however, may use other data capacities per memory cell (e.g., such as one, two, four, or five bits of data per memory cell). FIG. 5 shows eight threshold voltage distributions, corresponding to eight data states. The first threshold voltage distribution (data state) S0 represents memory cells that are erased. The other seven threshold voltage distributions (data states) S1-S17 represent memory cells that are programmed and, therefore, are also called programmed states. Each threshold voltage distribution (data state) corresponds to predetermined values for the set of data bits. The specific relationship between the data programmed into the memory cell and the threshold voltage levels of the cell depends upon the data encoding scheme adopted for the cells. In one embodiment, data values are assigned to the threshold voltage ranges using a Gray code assignment so that if the threshold voltage of a memory erroneously shifts to its neighboring physical state, only one bit will be affected.

FIG. 5 shows seven read reference voltages, Vr1, Vr2, Vr3, Vr4, Vr5, Vr6, and Vr7 for reading data from memory cells. By testing (e.g., performing sense operations) whether the threshold voltage of a given memory cell is above or below the seven read reference voltages, the system can determine what data state (i.e., S0, S1, S2, S3, . . . ) a memory cell is in.

FIG. 5 also shows seven verify reference voltages, Vv1, Vv2, Vv3, Vv4, Vv5, Vv6, and Vv7. When programming memory cells to data state S1, the system will test whether those memory cells have a threshold voltage greater than or equal to Vv1. When programming memory cells to data state S2, the system will test whether the memory cells have threshold voltages greater than or equal to Vv2. When programming memory cells to data state S3, the system will determine whether memory cells have their threshold voltage greater than or equal to Vv3. When programming memory cells to data state S4, the system will test whether those memory cells have a threshold voltage greater than or equal to Vv4. When programming memory cells to data state S5, the system will test whether those memory cells have a threshold voltage greater than or equal to Vv5. When programming memory cells to data state S6, the system will test whether those memory cells have a threshold voltage greater than or equal to Vv6. When programming memory cells to data state S7, the system will test whether those memory cells have a threshold voltage greater than or equal to Vv7. FIG. 5 also shows Vev, which is a voltage level to test whether a memory cell has been properly erased.

In one embodiment, known as full sequence programming, memory cells can be programmed from the erased data state S0 directly to any of the programmed data states S1-S7. For example, a population of memory cells to be programmed may first be erased so that all memory cells in the population are in erased data state S0. Then, a programming process is used to program memory cells directly into data states S1, S2, S3, S4, S5, S6, and/or S7. For example, while some memory cells are being programmed from data state S0 to data state S1, other memory cells are being programmed from data state S0 to data state S2 and/or from data state S0 to data state S3, and so on. The arrows of FIG. 5 represent the full sequence programming. The technology described herein can also be used with other types of programming in addition to full sequence programming (including, but not limited to, multiple stage/phase programming). In some embodiments, data states S1-S7 can overlap, with controller 122 relying on error correction to identify the correct data being stored.

FIG. 6 is a table describing one example of an assignment of data values to data states. In the table of FIG. 6, S0=111. S1=110, S2=200, S3=000, S4=010, S5=011, S6=001 and S7=101. Other encodings of data can also be used. No particular data encoding is required by the technology disclosed herein. In one embodiment, when a block is subjected to an erase operation, all memory cells are moved to data state S0, the erased state. In the embodiment of FIG. 6, all bits stored in a memory cell are 1 when the memory cells is erased (e.g., in data state S0).

As discussed above, the Vth can vary for different select gates due to normal process variations. The Vth of different select gate transistors typically has a distribution about a median value. To minimize errors during operation of the memory system, the Vth distribution should be a narrow as possible. If the Vth of a population of select gates varies by too much, then operation of the block (e.g., writing and reading) can be impacted such that errors occur. To remedy the situation where Vth has varied too much, it is proposed to adjust the Vth of one or more select gates. Techniques provided herein allow evaluation and adjustment of the threshold voltage (or other non-volatile property) of a select gate. It has been observed by the present inventors that the adjusting of the threshold voltage of the select gates at lower temperatures can lead to less precise control of the target threshold voltage as compared to adjusting of the threshold voltage of the select gates at higher temperatures. For example, programming the threshold voltage of select gates at lower temperatures can result in a wider distribution of threshold voltages, including a possible upper tail in the threshold voltage distribution for the select gates, as compared to programming the threshold voltage of select gates at higher temperatures. Additionally, programming the threshold voltage of select gates at lower temperatures will usually take longer than programming the threshold voltage of select gates at higher temperatures. Therefore, it is proposed to perform the programming of the threshold voltage of select gates as a function of temperature. The processes described herein can be applied to adjusting threshold voltage or another property of different types of select gates. For example, the processes described herein can be applied to adjusting threshold voltages of drain side select gates and/or source side select gates.

Figure 7:
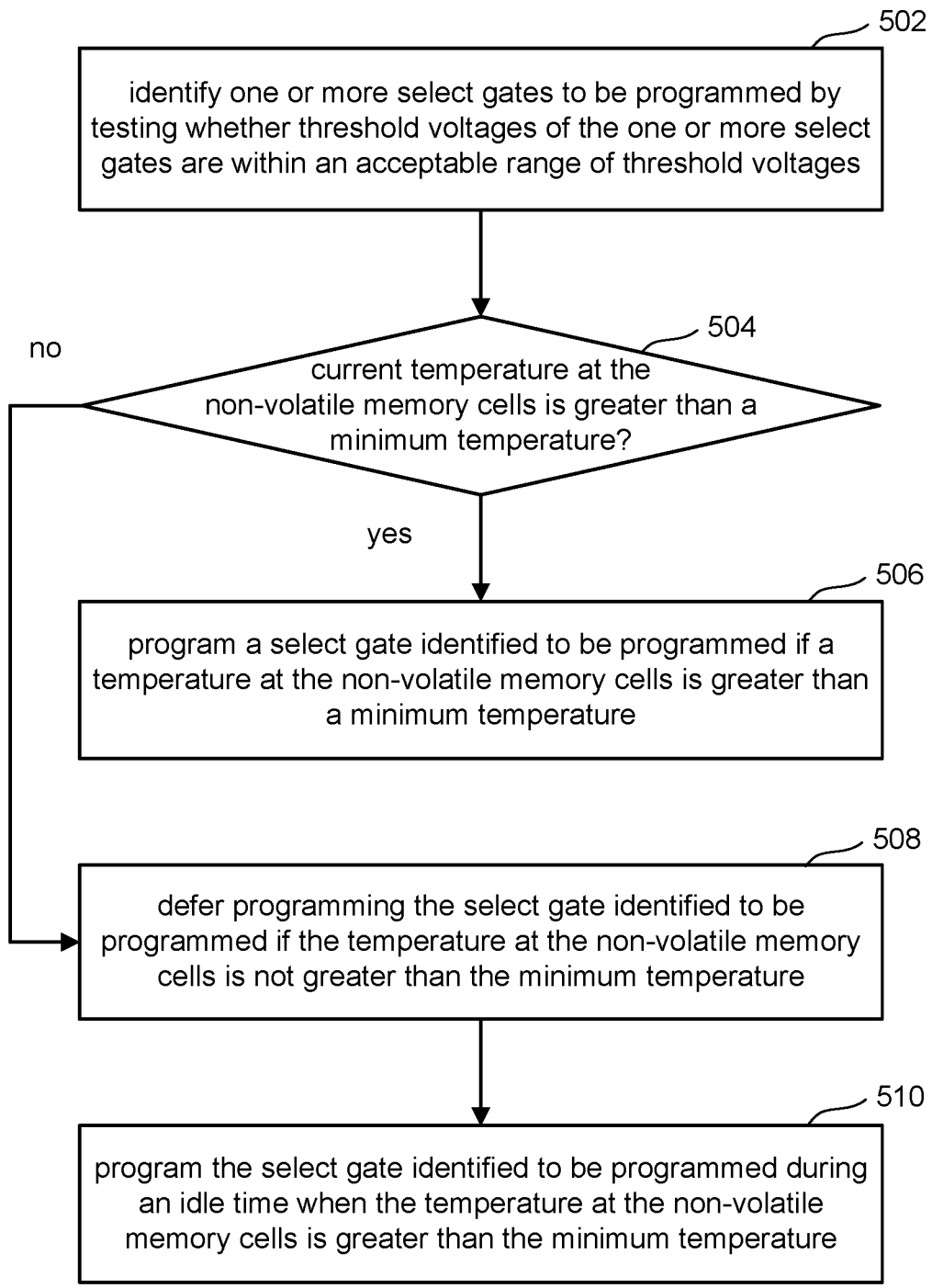
FIG. 7 is a flow chart describing one embodiment of a process for adjusting (e.g. programming or otherwise changing) threshold voltages of select gates as a function of temperature.

FIG. 7 is a flow chart describing one embodiment of a process for programming (e.g. or otherwise adjusting) threshold voltages of select gates as a function of temperature. In one embodiment, the process of FIG. 7 is performed by or at the direction of the one or more control circuits mentioned above. For example, the process of FIG. 7 can be performed by or at the direction of controller 102. In one example implementation, controller 102 performs the process of FIG. 7 by sending instructions to a memory die 300 to perform various tasks/operations. In step 502 of FIG. 7, the one or more control circuits identify one or more select gates to programmed by testing whether the threshold voltages (or other non-volatile properties) of the one or more select gates are within an acceptable range of the threshold voltages. In one example embodiment, controller 102 sends a series of one or more commands to a memory die 300 to test whether all of the select gates (or all of the drain side select gates) for a block or multiple blocks are within an acceptable range of threshold voltages. The testing will be performed by the memory die 300 using control circuitry 310, rewrite circuit 328 and decoders 324/332. The results will be reported back to the controller 102. For example, memory die 300 can report back the number of select gates that are not within the acceptable range of the threshold voltages. Alternatively, memory die 300 can report which specific select gates are not within an acceptable range of threshold voltages. In another alternative, memory die 300 will report back which blocks have drain side select gates that are not within the acceptable range of threshold voltages.

Figure 8:
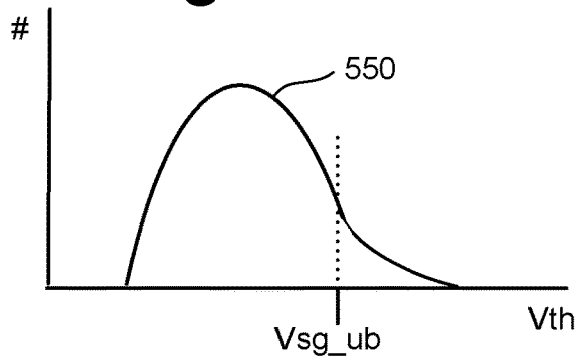
FIG. 8 is a graph depicting a threshold voltage distribution for a population of select gates.

FIG. 8 is a graph depicting threshold voltages distribution 550 for a population of select gates. The Y axis is the number of select gates. The X axis is threshold voltage (Vth). FIG. 8 shows one specific threshold voltage Vsg_ub. This represents the upper boundary for an acceptable range of threshold voltages. In one embodiment, a select gate has a threshold voltage within an acceptable range of threshold voltages if the threshold voltage of the select gate is within distribution 550 and less than Vsg_ub. In another embodiment, the acceptable range of the threshold voltage will also have a lower boundary. Thus, one embodiment of step 502 includes testing whether the threshold voltage of a select gate is less than Vsg_ub. As can be seen from FIG. 8, threshold voltage distribution 550 includes an upper tail, where the upper tail is defined as that portion of threshold voltage 550 above Vsg_ub. In an ideal memory system, there will be no upper tail. When an upper tail exists, the memory can makes encounter errors writing and reading data because some of the select gates have threshold voltages that are too high. Another embodiment of step 502 includes testing whether the threshold voltage of a select gate is less than Vsg_ub and greater than a lower bound.

Looking back at FIG. 7, in step 504, the one or more control circuits determine whether the current temperature of the non-volatile memory cells is greater than a minimum temperature. In one embodiment, the minimum temperature is 85° Celsius (C.). In another embodiment, the minimum temperature is 40° C. In another embodiment, the minimum temperature is chosen from a range of 40° C.-85° C. In one example implementation of step 504, controller 102 sends a command to memory die 300 to instruct memory die 300 to sense the current temperature on memory die 300 (which includes memory structure 326). Memory die 300 (see FIG. 2) includes temperature detection circuit 318 which can sense the current temperature. That sensed current temperature is then sent back to controller 102. In another embodiment, memory die 300 will only report whether the current temperature is above or below the minimum temperature.

If, in step 504, it is determined that the current temperature at the non-volatile memory cells is greater than the minimum temperature, then the select gates identified in step 502 are programmed. In one embodiment, step 502 includes identifying blocks that have drain side select gates that need to be programmed and step 506 includes programming the drain side select gates in those blocks identified in step 502. More details of step of 506 are provided below.

If it is determined that the current temperature at the non-volatile memory cells is not greater than the minimum temperature (step 504), then in step 508 the one or more control circuits will defer programming the select gates identified to be programmed in step 502 because the temperature of the non-volatile memory cells is not greater than the minimum temperature. Thus, the one or more control circuits will put off or postpone programming to a later time. In one example embodiment, controller 102 will store an indication of those select gates that need to be programmed but are having the programming being deferred due to the temperature being not greater than the minimum temperature. In step 510, the one or more control circuits will program the select gates identified to be programmed in step 502 during an idle time when the temperature of the non-volatile memory cells is greater than the minimum temperature. For example, in one embodiment, when controller 102 is idle, controller 102 will request the current temperature from the memory die 300. If the temperature is greater than the minimum temperature, then controller 102 will instruct memory die 300 to program the threshold voltages of the select gate(s) identified in step 502. In another embodiment, the system will wait for the memory die 300 to be idle. When the memory die 300 is idle, it will sense the current temperature. If the current temperature is above the minimum temperature, the memory die 300 can automatically adjust the threshold voltages of the select gates that need to be programmed or can inform the controller that the memory die is idle and the temperature is above the minimum temperature so that the controller can made a decision whether to instruct the memory die 300 to program the select gates identified to be programmed. In one example implementation, step 508 includes deferring programming of one or more select gates until the controller or system is idle and the temperature is greater than the minimum temperature (e.g., step 510). Thus, the time between steps 508 and 510 is variable and can be a short time or a long time.

Figure 9:
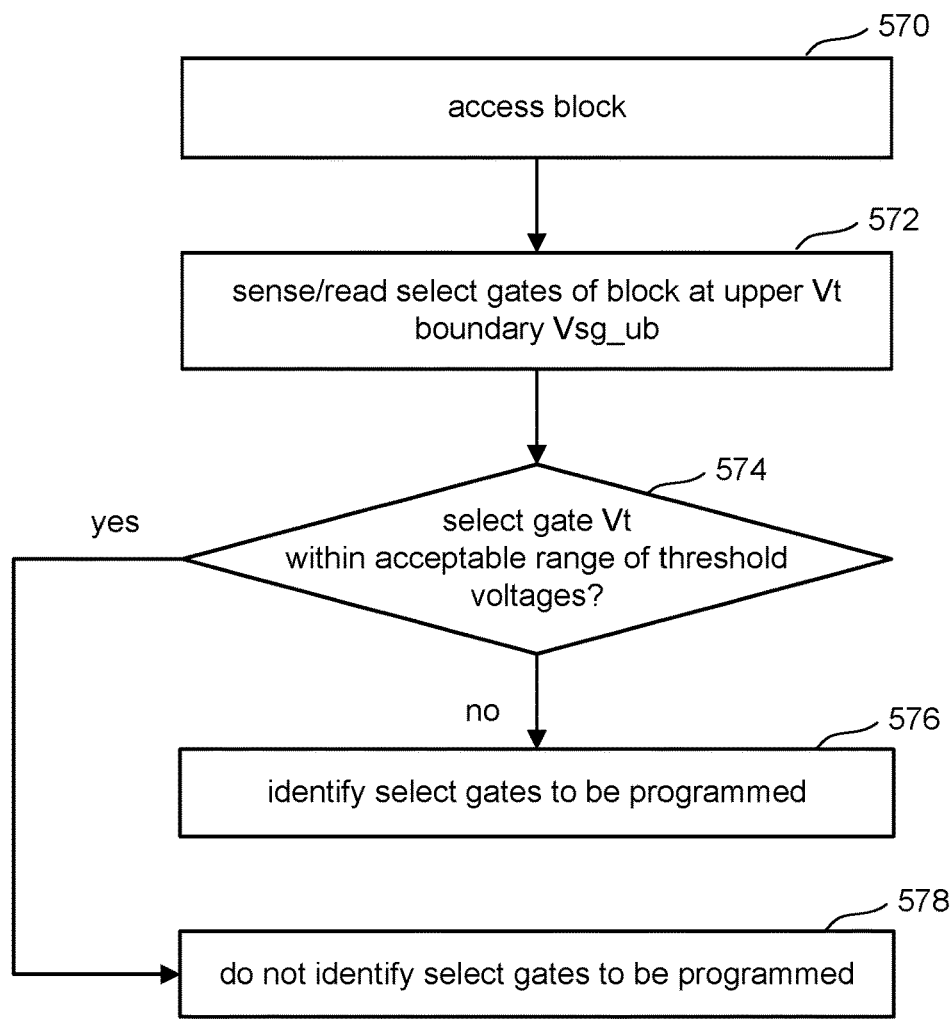
FIG. 9 is a flow chart describing one embodiment of a process for identifying one or more select gates to be programmed by testing whether threshold voltages of the one or more select gates are within an acceptable range of threshold voltages. For example, this process can be used to test and determine that drain side select gates of a block need to be programmed.

FIG. 9 is a flowchart describing one embodiment of a process for identifying one or more select gates to be programmed by testing whether the threshold voltages of the one or more select gates are within an acceptable range of threshold voltages. That is, the process of FIG. 9 is one example implementation of step 502 of FIG. 7. In one embodiment the process of FIG. 9 is performed by or at the direction of one or more control circuits mentioned above. For example, the process of FIG. 9 can be performed at the direction of controller 102, using the circuits of FIG. 2 on memory die 300. That is, in one example implementation, controller 102 performs the process of FIG. 9 by sending instructions to memory die 300 to perform the various tasks/operations of FIG. 9, such that memory die 300 uses control circuitry 310, read/write circuits 328 and decoders 324-332 to perform the individual operations described below with respect to FIG. 9. In one embodiment, the process of FIG. 9 is performed periodically. For example, the process of FIG. 9 can be performed for all blocks of a memory die after the memory die has been cycled 5,000 (or another number of) times, with each cycle including programming and erasing (or writing). Subsequently, the process of FIG. 9 can be performed after every subsequent 1,000 cycles (or another number of cycles). In another embodiment, the process of FIG. 9 can be performed after an error occurs, such as a programming error or a reading error.

In step 570 of FIG. 9, a block is accessed. Thus, the process of Figure is 9 is performed for one block. It is contemplated that the process of FIG. 9 can be performed multiple times (serially or in parallel), once for each block; therefore, a system that has thousands of blocks will perform the process of FIG. 9 thousands of times. In the example where the process of FIG. 9 (and the process of FIG. 7) is performed periodically (e.g. after the first 5,000 cycles and then after every 1,000 cycles), at each period for performing the process of FIG. 9, the process will be performed once for each block. In other embodiments, the process of FIG. 9 will only be performed for a subset of blocks. A particular block to be tested is accessed in step 570. In step 572, a sensing operation will be performed for all of the select gates (or all of the drain side select gates) of the block at the upper threshold voltage boundary Vsg_ub (see FIG. 8). For example, the voltage Vsg_ub can be applied to the control gate signal (SGD0, SGD1, SGD2, SGD3) for the drain side select gates and then the system can determine whether the drain side select gates conduct or do not conduct. In one embodiment, all the drain side select gates (or multiple drain side select gates) can be sensed at the same time by applying the voltage Vsg_ub to the various control signals connected to the control gates (e.g. SGD0, SGD1, SGD2, and SGD3—see FIG. 4F). In other embodiments, the sensing of step 572 can be performed on the source side select gates instead of or in addition to the drain side select gates. In step 574 of FIG. 9, it is determined whether the threshold voltage for the select gates are within the acceptable range of the threshold voltages. For example, if the tested select gate conducted in response to Vsg_ub being applied to its control gate via the control line, then the threshold voltage for that select gate is less than Vsg_ub; therefore, the threshold voltage for that select gate is within the acceptable range of the threshold voltages. If the select gate did not conduct current in response to Vsg_ub being applied to its control gate, then the threshold voltage of that select gate is above Vsg_ub; therefore, the threshold voltage of that select gate is not within the acceptable range of threshold voltages.

If, in step 574, it is determined that the select has a threshold voltage within the acceptable range of threshold voltages then that select gate is not identified as a select gate to be programmed in step 578. If, in step 574, it is determined that the select gate is not within the acceptable range of threshold voltages, then that select gate is identified as a select gate to be programmed in step 576. In some embodiments, select gates of a block are individually identified to be programmed or not to be programmed. In another embodiment, the determination to program or not program a select gate is performed at the block level. That is, if any one select gate of a block (or any one drain side select gate of a block) is not within the acceptable range of threshold voltages then all the select gates for the block will be identified to be programmed. In another embodiment, all the select gates (or all the drain side select gates) of a block will be identified to be programmed if more than a minimum number of select gates have a threshold voltage outside the acceptable range of threshold voltages. Thus, in one embodiment, the decision to identify a select gate to be programmed is made on an individual select gate basis. In another embodiment, the decision whether to program select gates is made on a block by block basis. In other embodiments, other groupings of select gates can be made in order to make a decision based on the grouping.

Figure 10A:
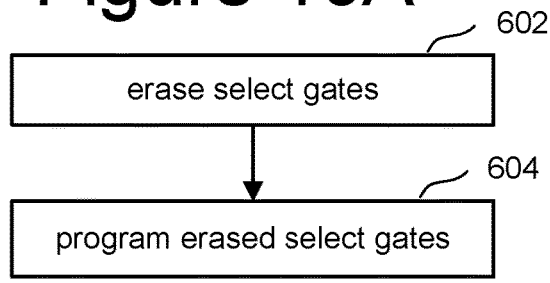
FIG. 10A is a flow chart describing one embodiment of a process for programming one or more select gates.
Figure 10B:
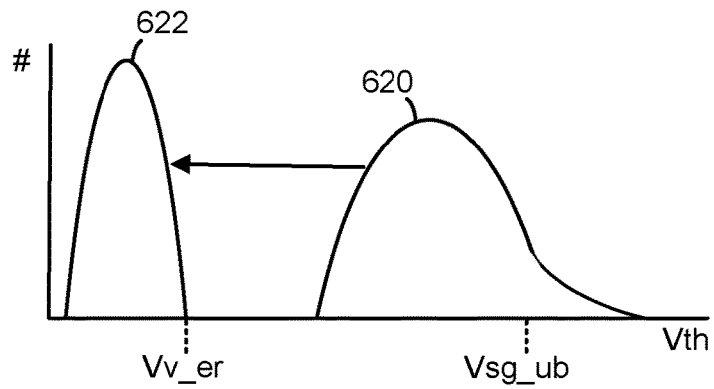
FIG. 10B is a graph depicting threshold voltage distribution for a set of select gates being erased.

FIG. 10A is a flowchart describing one embodiment of a process of programming a select gate identified to be programmed. Thus, the process of FIG. 10A is one example implementation of step 506 of FIG. 7. In one embodiment, the process of FIG. 10A is performed by or at the direction of the one or more control circuits mentioned above. For example, the process of FIG. 10A can be performed by or at the direction of controller 102. In one example implementation, controller 102 performs the process of FIG. 10A by sending instructions to memory die 300 such that memory die 300 can perform the erasing and programming as instructed. In step 602 of FIG. 10A, the one or more control circuits erase the select gates identified to be programmed. In one embodiment, the select gates are erased such that they enter the erase state (e.g. State 0 of FIG. 5). In another embodiment, the erasing of step 602 includes some erasing such that the threshold voltages of the select gates are lowered but not all the way to State 0 of FIG. 5. For example, FIG. 10B shows a graph of two threshold voltage distributions 620 and 622. Threshold voltage distribution 620 is a distribution of threshold voltage for a population of select gates having a tail such that some or more of the select gates have a threshold voltage greater than Vsg_ub. Threshold voltage distribution 620 of FIG. 10B is analogous to threshold voltage distribution 550 of FIG. 8. The process of erasing in step 602 of FIG. 10A includes adjusting the threshold voltages of the select gates such that the threshold distribution moves from distribution 620 to distribution 622. This can include performing an erase process that uses Vv_er as an erase verify voltage level such that memory select gates are erased until their threshold voltage is below Vv_er. Threshold voltage distribution 622 may only be a couple of volts below threshold voltage distribution 620. One embodiment of step 602 includes controller 102 instructing memory die 300 to perform the erasing operations.

Figure 10C:
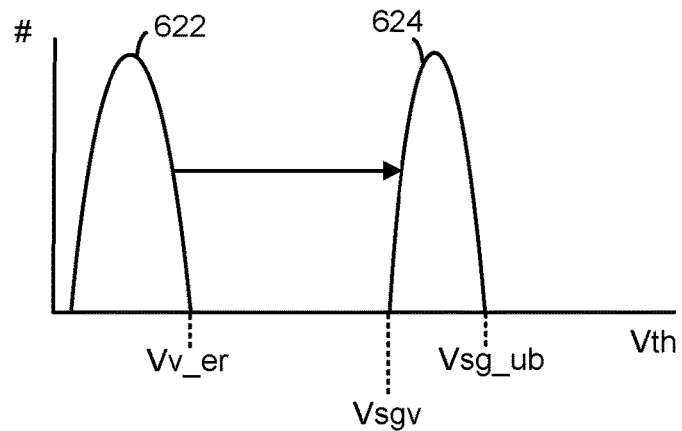
FIG. 10C is a graph depicting threshold voltage distribution for a set of select gates receiving programming.

In step 604 of FIG. 10A, the one or more control circuits program the select gates that were erased in step 602. For example, FIG. 10C shows the threshold voltage distribution 622 for those select gates that are erased being moved to threshold voltage distribution 624 as a result of programming (e.g., adjusting the threshold voltage of the select gates). Threshold voltage distribution 624 has the lower bounds at Vsgv and upper bounds at Vsg_ub. As can be seen, the threshold voltage distribution 624 does not have an upper tail and is much narrower than threshold voltage distribution 620 of FIG. 10B. Therefore, in one embodiment, the process of programming of step 604 includes adjusting the threshold voltages of the select gate such that the threshold voltage distribution of the select gates tightens and removes an upper tail. One embodiment of step 604 includes controller 102 instructing memory die 300 to perform the programming operations.

Note that some memory systems refer to the erasing and programming as writing such that the memory system writes at least two data values. The nomenclature of erase/program versus writing does not change the function as it relates to the new technology proposed herein.

Figure 11:
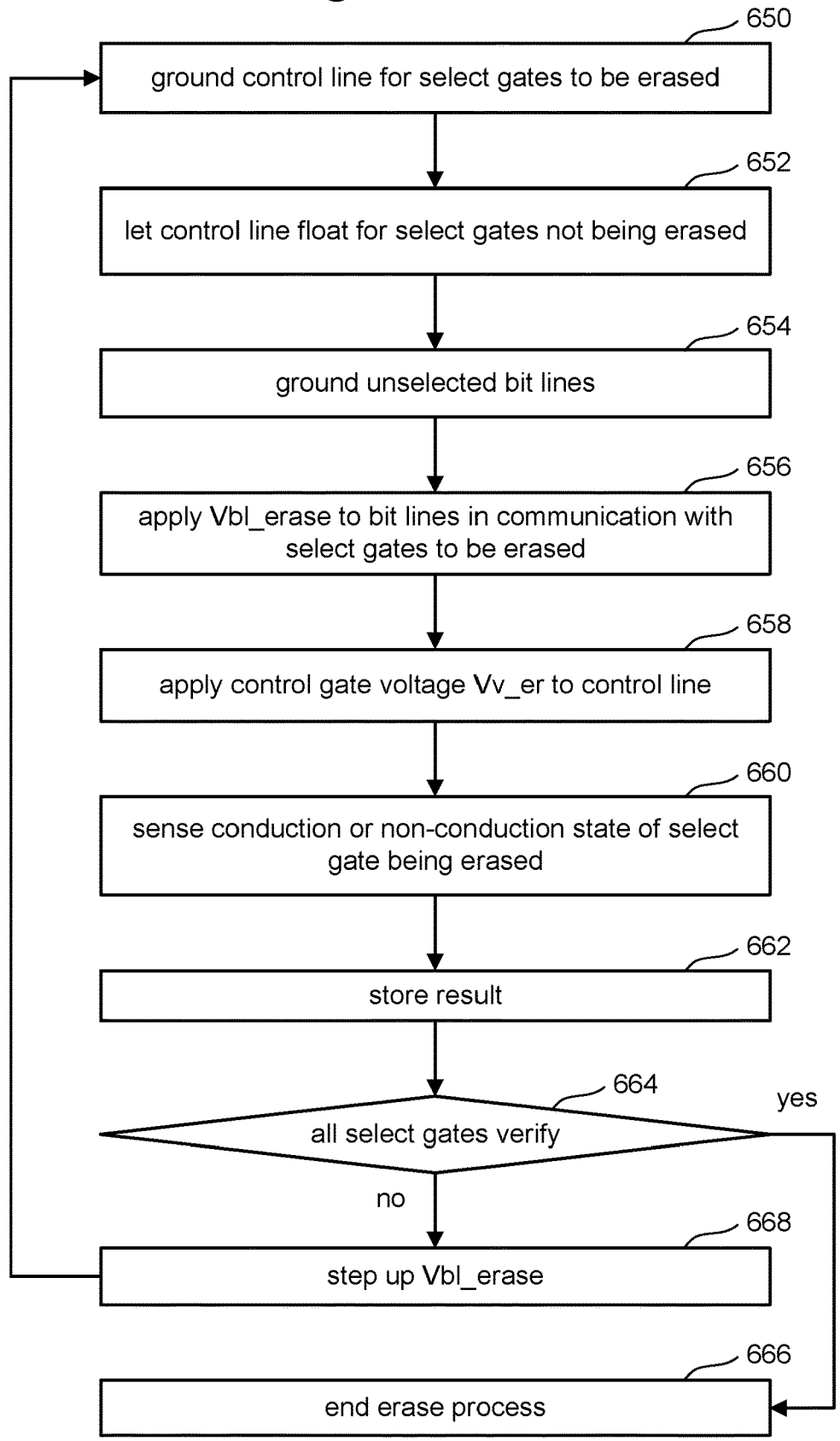
FIG. 11 is a flow chart describing one embodiment of a process for erasing select gates.

FIG. 11 is a flowchart describing one embodiment of a process for erasing select gates. That is, the process of FIG. 11 is one example implementation of step 602 of FIG. 10A. In one embodiment, the process of FIG. 11 is performed by or at the direction of the one or more control circuits mentioned above. For example, the process of FIG. 11 can be performed by at the direction of controller 102. In one example implementation, controller 102 performs the process of FIG. 11 by sending instructions to memory die 300 to perform the various tasks/operations. In one embodiment, an erase process includes erasing and erase verify. In the process of FIG. 11, step 650-656 include erasing and steps 658-664 include erase verify. In one embodiment, controller 102 will send an instruction to perform erasing and send a subsequent instruction to perform erase verify. In response to those instructions, the steps of FIG. 11 are performed by memory die 300. In another embodiment, controller 102 will send an individual instruction for each of the steps of FIG. 11, and in response to those instructions the appropriate operation will be performed by memory die 300. In another embodiment, controller 102 will send an instruction to perform the process of FIG. 11 and the memory die will then perform step 650-668 in response thereto.

In step 650, the control line of the select gates to be erased are grounded. In one embodiment, all the select gates (or all the drain side select gates for a block) will be erased together. Therefore, all of the control lines (SGD0, SGD1, SGD2, SGD3, SGS0, SGS1, SGS2, SGS3) will be grounded. In an embodiment where only the drain side select gates are being erased, the control signals SGD0, SGD1, SGD2, and SGD3 will be grounded. In step 652, the control lines for select gates not being erased will be floated. In embodiments where some drain side select gates for a block will be erased and some will not, those select gates not being erased will have their respective control lines floated. In step 654 of FIG. 11, unselected bit lines are grounded. That is, bit lines connected to or in communication with select gates not being selected for programming and erasing are grounded. In step 656, the erase voltage Vbl_erase is applied to bit lines that are in communication with select gates to be erased. That is, selected bit lines receive the erase voltage. In one embodiment, the erase voltage is a series of voltage pulses that increase in magnitude from pulse to pulse. As a result of step 650-656, the selected select gates experience some erasing.

In step 658, a compare voltage is driven on the control gate for those select gates that were erased to see if they have completed erasing. For example, the control gate voltage Vv_er (see FIG. 10B) is applied to the control lines (e.g. SGD0, SGD1, SGD2, and SGD3). In steps 660, the sense blocks 350 (see FIG. 2) will sense a conduction state or a non-conduction state or the select gates being erased. That result is stored in step 662 in latches for the respective sense blocks. If all the select gates for a block successfully verify as being properly erased in step 664 then the erase process is complete in step 668. Otherwise, the erase process must continue at step 666. To continue, the erase voltage, Vbl_erase, is stepped up in magnitude for the next pulse. The process then continues at step 650 and another iteration of the process of FIG. 11 is performed until all (or a sufficient number) of select gates have properly verified the erase process.

Figure 12:
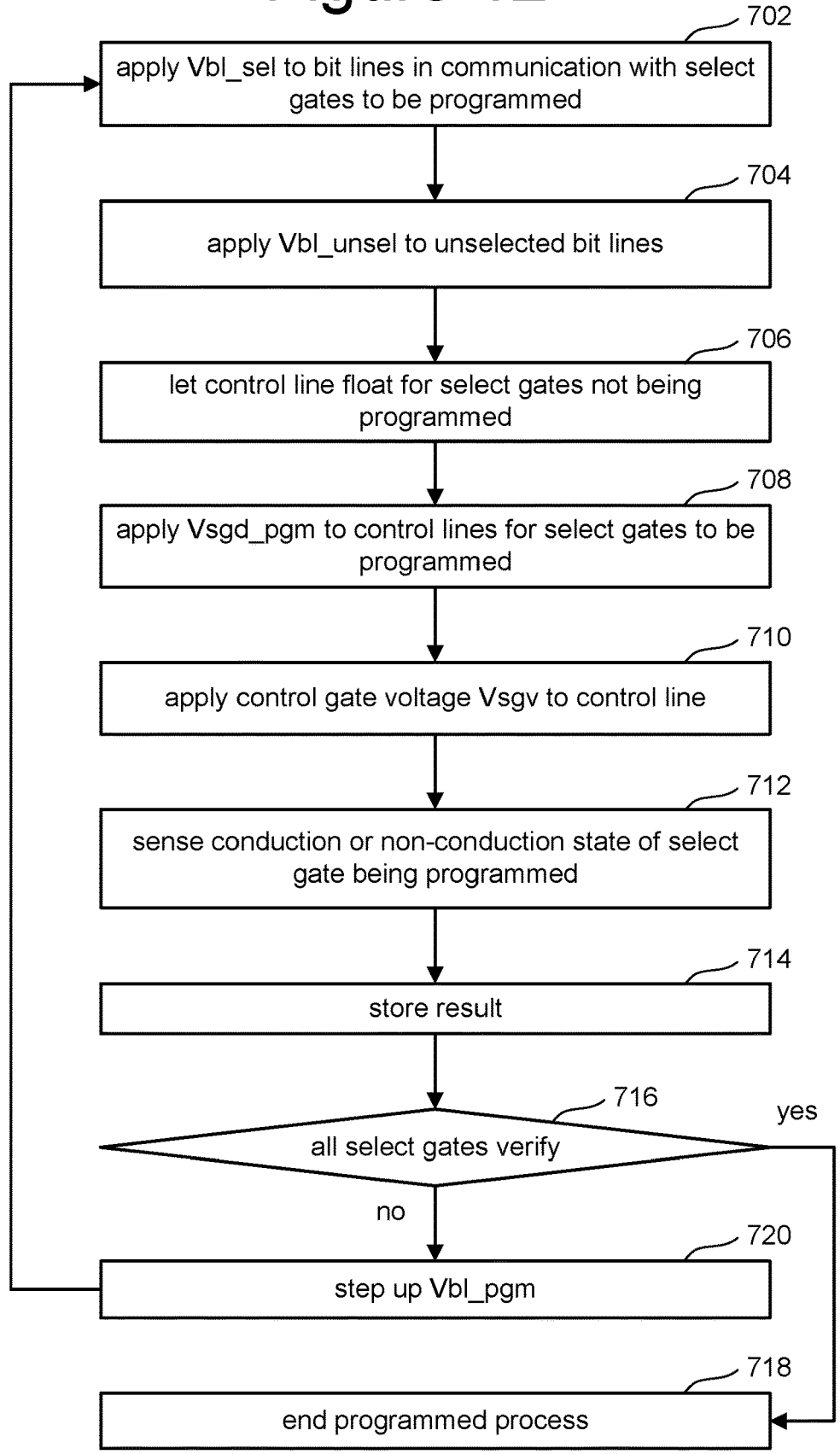
FIG. 12 is a flow chart describing one embodiment of a process for programming select gates.

FIG. 12 is a flowchart describing one embodiment of a process of programming select gates. That is, the process of FIG. 12 is one example implementation of step 604 of FIG. 10A. In one embodiment, the process of FIG. 12 is performed by or at the direction of the one or more control circuits mentioned above. For example, the process of FIG. 12 can be performed by or at the direction of controller 102. In one example implementation, controller 102 performs the process of FIG. 12 by sending instructions to memory die 300 to perform the various tasks/operations. For example, controller 102 can send one instruction to perform the entire process of FIG. 12. Alternatively, controller 102 can send a separate instruction for each of the steps of FIG. 12. Note that the programming of FIG. 12 includes programming (steps 702-78) and program verify (steps 710-716). In one embodiment, controller 102 sends an instruction to program and in response memory die 300 performs steps 702-78; and controller 102 can send an instruction to perform program verify and in response memory die 300 performs steps 710-716.

In step 702 of FIG. 12, the voltage Vbl_sel is applied to bit lines in communication with select gates to be programmed. In step 704, the voltage Vbl_unsel is applied to unselected bit lines, which are bit lines connected to select gates that are not identified to be programmed. In step 706, control lines for select gates not being programmed are allowed to float. In step 708, the program voltage Vsgd_vpgm is applied to control lines for select gates to be programmed. In one embodiment the program voltage Vsgd_vpgm is a series of voltage pulses with each successive pulse being a higher magnitude than the previous pulse. In response to steps 702-78, the select gates should experience some programming such that the threshold voltage is raised.

In step 710 of FIG. 12, the control gate voltage Vsgv is applied to the control line for the select gates that were programmed. Vsgv is the compare voltage used to indicate whether the threshold voltage has been sufficiently raised. For example, FIG. 10C shows Vsgv as the lower boundary of target threshold voltage distribution 624. In step 712, the sense blocks 350 are used to sense the conduction or non-conduction state of the select gates being programmed. If a select gate is conducting in response to applying Vsgv to its respective control line (e.g. SGD0, SGD1, SGD1, or SGD3), then the threshold voltage of the select gate is less than Vsgv and the select gate is not verified. If the select gate is in a non-conduction state, then the threshold voltage is above Vsgv and the select gate has verified programming. In step 714, the results of step 712 are stored. In step 716, it is determined whether all the select gates for the block (or all the select gates being programmed or all of the select gates being tested) have verified. If so, then the programming process is over in step 718. Otherwise, in step 720, the program voltage Vbl_pgm is stepped up to the next magnitude and the process continues in at 702 for another iteration of program and verify.

FIGS. 13A-13E depict example voltages during the erase process of FIG. 11 during one iteration of steps 650-656. FIGS. 13A-13E have a common time axis but the time increments are not necessarily equally spaced and the drawings are not necessarily to scale. An erase operation can include multiple erase-verify iterations. Each erase-verify iteration can include an erase portion (e.g., steps 650-566 of FIG. 11) followed by a verify portion (e.g., steps 658-664 of FIG. 11).

Figure 13A:
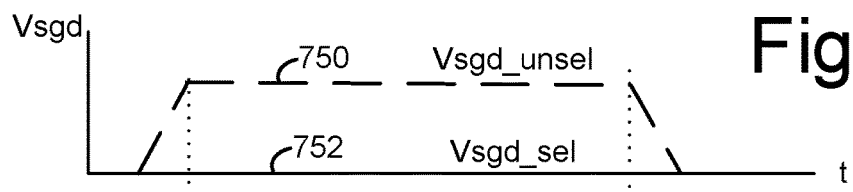
FIGS. 13A-E depict various signals during an erase process.

FIG. 13A depicts example voltages (Vsgd) for the control gates of selected drain side select gates (Vsgd_sel) and the unselected drain side select gates (Vsgd_unsel). Note that "sel" is shorthand for "selected" and "unsel" is shorthand for "unselected." In one approach, Vsgd_sel (waveform 752) is driven at Vss=0 V, and Vsgd_unsel (waveform 750) is floated. Or, Vsgd_unsel can be driven, such as at 8-10 V. In one embodiment, the selected and uninhibited drain side select gate is a transistor which is to be erased in an erase iteration. A selected drain side select gate may become inhibited later in the erase operation when it reaches an erase-verify condition. A selected drain side select gate is in a memory string having a drain end in communication with a selected bit line. An inhibited drain side select gate is a transistor which is not to be erased in an erase iteration. An inhibited drain side select gate is in a memory string having a drain end in communication with an unselected bit line.

Figure 13B:
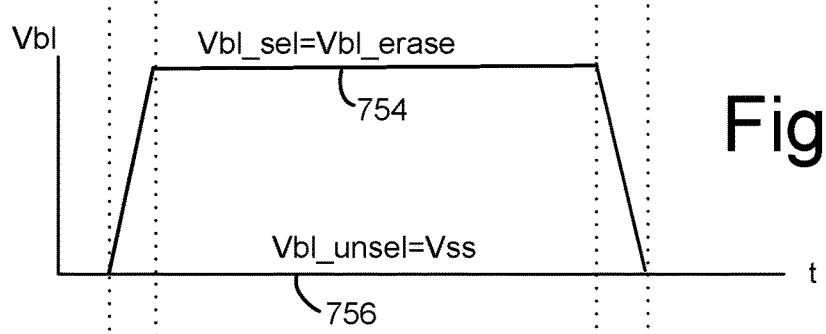

In one embodiment, the erase process includes applying an erase pulse (voltage pulse) applied on the bit line. FIG. 13B depicts example voltages for selected bit lines (Vbl_sel) in communication with selected drain side select gates and unselected bit lines (Vbl_nsel) in communication with inhibited drain side select gate. Vbl_sel (waveform 754) is set to the amplitude of the current erase pulse (e.g., Vbl_erase). The unselected bit lines connected to drain side select gates that are not being erased receive Vbl_unsel (waveform 756) driven at Vss. The bit line voltage is ramped up, maintained at a peak level and then ramped down from to form a pulse. In FIG. 13B, the erase pulse 754 is depicted as having a uniform amplitude at a peak level through the pulse for simplicity; however, other shapes can also be implemented. Alternatively, the voltage is stepped up to the peak level in one or more steps in an erase pulse. Further, a one-sided erase can be used which applies a voltage to the drain-end of a NAND string via a bit line to charge up the NAND string, while the source-end of the NAND string is not used to charge up the NAND string.

Figure 13C:
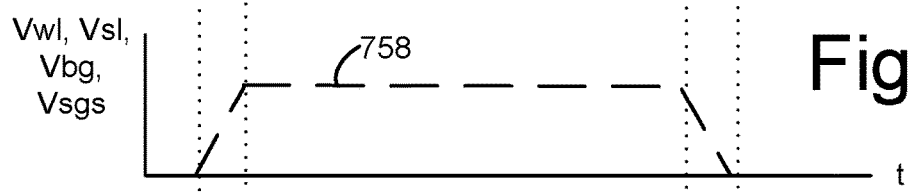

FIG. 13C depicts example voltages for a word line (Vwl), select line (Vsl), back gate (Vbg) and source side select gate transistor (Vsgs) (Vsgs_sel or Vsgs_unsel). As depicted by waveform 758, these voltages can be allowed to float. Although one waveform is shown for simplicity, these voltages may float at different respective levels. Optionally, some or all of these voltages are driven. For example, Vwl and Vbg can be set at e.g., 8 V. Vsgs_sel and Vsgs_unsel can be driven at e.g. 8 V. Vsl can be driven at e.g. 10 V to cutoff the strings at the source side, such that Vgs (gate-to-source voltage) of the SGS transistor is −2 V. For the selected sub-block, Vsgd_sel is biased at 0 V with the selected bit line Vbl_sel at 15-20 V to erase the associated drain side select gate, and with the unselected bit line at, e.g., 8-10 V to inhibit the associated SGD transistors. For the unselected sub-block, Vsgd_sel is biased at 8-10 V with the selected bit line Vbl_sel at 15-20 V and the unselected bit line at 8-10 V, so drain side select gates associated with the SGD line are all not erased.

Figure 13D:
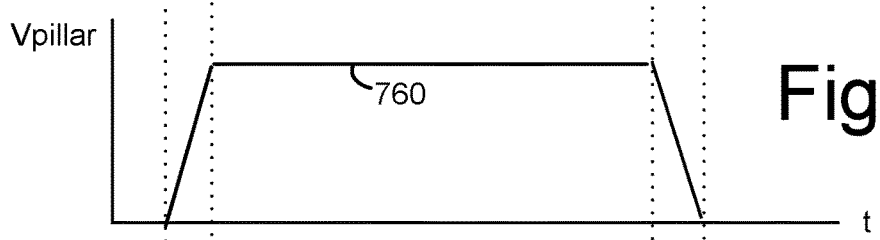

FIG. 13D depicts a pillar voltage (Vpillar) for a selected drain side select gate. As depicted by waveform 760, Vpillar generally tracks Vbl and can increase due to GIDL current. GIDL current at a select gate is determined by the bias difference (Vdg=Vd−Vg), between the drain voltage (Vd) and the gate voltage (Vg) of the select gate. The GIDL current density can be modeled by: $J=A*Es*\exp(-B/Es)$, where Es is the transverse electric field at the surface, and Es=(Vdg+C)/Tox. Thus, J=A'*(Vdg+C)*exp(-B'/(Vdg+C)), where A', B' and C are constants determined by some physical parameters. Normally, Vdg>>Vth of the select gate to obtain a considerable GIDL current. In some cases, Vdg>2-5 V is needed to generate enough GIDL for an erase pulse width of about one msec.

Figure 13E:
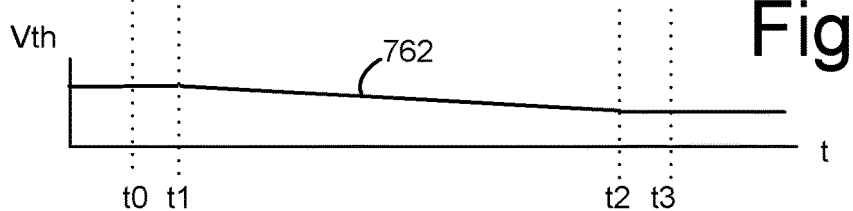

FIG. 13E depicts a Vth (threshold voltage) of a drain side select gate being erased. As depicted by waveform 762, the Vth for an example drain side select gate which is being erased is lowered when Vbl is raised. In one embodiment during erasing, Fowler-Nordheim tunneling occurs in the drain side select gate drain and gate overlap region so that the transistor begins experience a lowering of its threshold voltage.

Figure 14A:
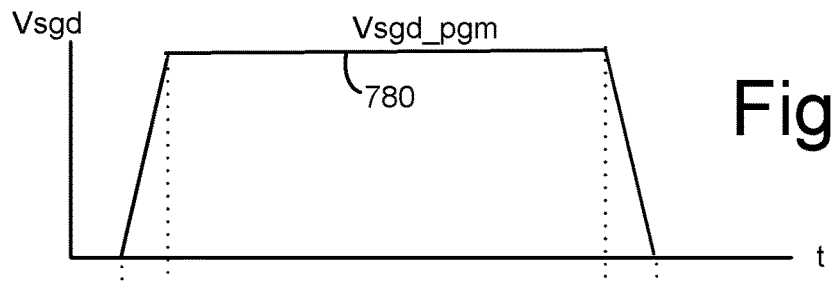
FIGS. 14A-E depict various signals during a programming process.

FIGS. 14A-14E depict example voltages during the program portion of a program-verify iteration of the programming process of FIG. 12 (during one iteration of steps 702-708 of FIG. 12). FIG. 14A depicts waveform 780 representing an example voltage signal (Vsgd_pgm) applied (e.g., as a voltage pulse) to the control gates of a selected control line (e.g., SGD0, SGD1, SGD2, SGD3) connected to drain side select gates being programmed. In one approach, the voltage pulses increase in amplitude from pulse to pulse (e.g., 15-20 V).

Figure 14B:
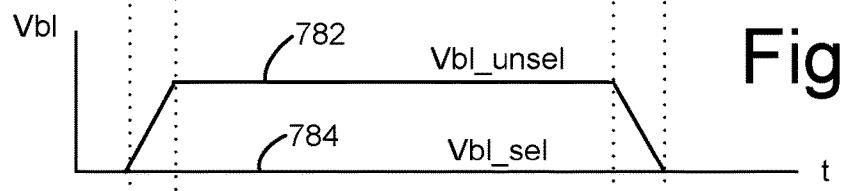

FIG. 14B depicts example voltages for selected bit lines (Vbl_sel) in communication with selected drain side select gates, and unselected bit lines (Vbl_unsel) in communication with inhibited drain side select gates. Vbl_unsel (waveform 782) is driven to a non-zero level (e.g., 8-10 V), less than Vsgd_pgm, while Vbl_sel (waveform 784) is at Vss (e.g., ground).

Figure 14C:
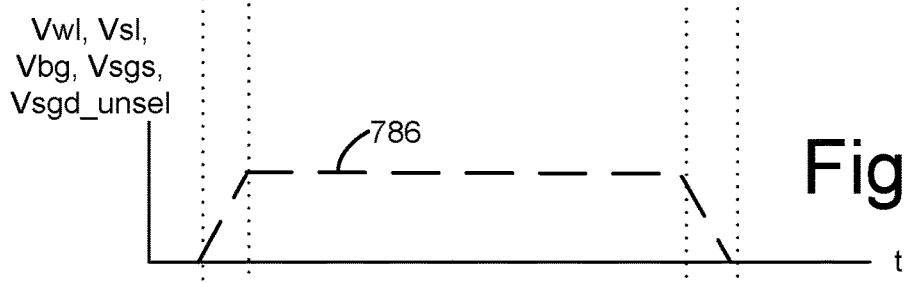

FIG. 14C depicts example voltages for a word line (Vwl), source line (Vsl), back gate (Vbg), a SGS line (Vsgs), and an unselected SGD line (Vsgd_unsel). As depicted by waveform 786, these voltages can be allowed to float. Although one waveform is shown for simplicity, these voltages can float at different respective levels. Optionally, some or all of these voltages are driven. For example, Vsgs_sel and Vsgs_unsel can be driven at e.g. 0 V. Vsl can be driven at e.g. 2 V to cutoff the strings at the source side, such that Vgs (gate-to-source voltage) of the SGS transistor is −2 V.

For the selected sub-block, Vsgd_pgm is 15-20 V with the selected bit line at 0 V to program the selected drain side select gates, and with the unselected bit line at, e.g., 8-10 V to inhibit the unselected drain side select gates. For the unselected sub-block, Vsgd_unsel is 0 V with the selected bit line at 0 V and the unselected bit line at 8-10 V, so drain side select gates associated with the unselected SGD line are not all programmed.

Figure 14D:
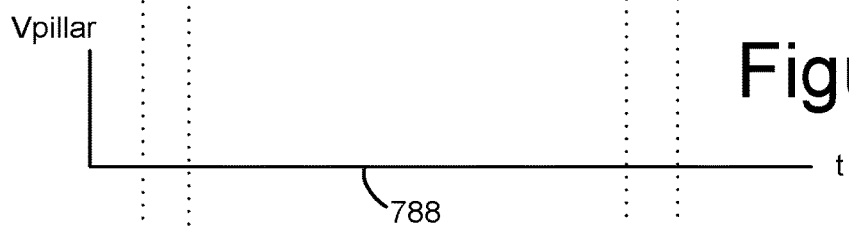

FIG. 14D depicts a pillar voltage (Vpillar) for a selected SGD transistor. Waveform 788 indicates that Vpillar follows Vbl_sel=Vss.

Figure 14E:
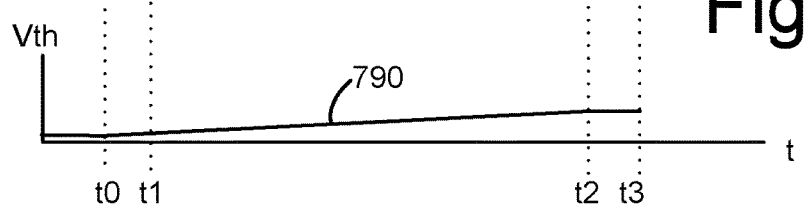

FIG. 14E depicts a threshold voltage (Vth) of a drain side select gates being programmed. Waveform 790 indicates that Vth increases gradually while Vsgd_pgm is applied. In one embodiment, Fowler-Nordheim tunneling occurs in drain side select gates drain and gate overlap region so that the selected drain side select gates experience an increase in threshold voltage.

FIG. 15 is a flowchart describing one embodiment of a process for adjusting (e.g., programming) threshold voltages of select gates as a function of temperature. In one embodiment, the process of FIG. 15 is performed by or at the direction of one or more control circuits mentioned above. For example, the process of FIG. 15 can be performed by or at the direction of controller 102. In one example implementation, controller 102 performs the process of FIG. 15 by sending instructions to a memory die 300 to perform various tasks/operations. In the embodiment of FIG. 15, if the temperature is not warm enough, the controller will cause the memory die 300 to perform dummy memory operations (e.g., multiple dummy read operations) in order to cause the memory die to become warmer. The more operations the memory die performs, the warmer the memory die will become. In some embodiments, speeding up operations of the memory die (e.g., increasing clock speed) can also increase the temperature of the memory die.

In step 802 of FIG. 15, the one or more control circuits identify one or more select gates to be programmed by testing whether threshold voltages of the one or more select gates are within an acceptable range of the threshold voltages. Step 802 of FIG. 15 is analogous to step 502 of FIG. 7 and can be implemented by the process of FIG. 9. In step 804, the one or more control circuits determine whether the current temperature at the non-volatile memory cells is greater than a minimum temperature. Step 804 of FIG. 15 is analogous to step 504 of FIG. 7. If the current temperature at the non-volatile memory cells is greater than the minimum temperature then at step 806 the one or more control circuits program the one or more select gates identified to be programmed. In one embodiment, step 806 includes controller 102 instructing memory die 300 to perform the process of FIG. 10A. Step 806 of FIG. 15 is analogous to step 506 of FIG. 7.

If the current temperature of the non-volatile memory cells is not greater than the minimum temperature (step 804), then in step 808 the one or more control circuits perform dummy memory operations (e.g., multiple dummy read operations) on the memory cells to raise the temperature of the memory cells. These are referred to as dummy memory operations or dummy read operations because the memory operations and/or read operations are not performed in response to a request for those operations to be performed by the host. Rather they are operations that are originated by the controller and only performed in order to raise the temperature of the memory cells. The data read is not used to service the host. When performing a memory operation, it is preferred that a read operation be performed instead of a programming operation because a read operation should not change any data while a program operation can change data. If enough dummy memory operations are performed, temperature should be increased at the memory cells. Temperature can further increase by operating at higher speeds. In one example implementation, step 808 includes controller 102 sending a plurality of read commands to memory die 300. In response to each read command, memory die 300 will perform one or more read operations and report the data read. The data read can be real data that the controller knows about. Alternatively, the data can be from word lines that are erased.

In step 810, the one or more control circuits can cause the programming of the select gates identified to be programmed after performing the dummy memory operations. That is, the dummy memory operations will raise the temperature of the memory cells. In step 810, the select gates will then be programmed after the temperature is raised. In one embodiment, the system will test to see whether the temperature is raised to be greater than the minimum temperature. If not, then an additional dummy memory operations will be performed until the memory cells are at a temperature that is equal to or greater than the minimum temperature discussed above.

Figure 16A:
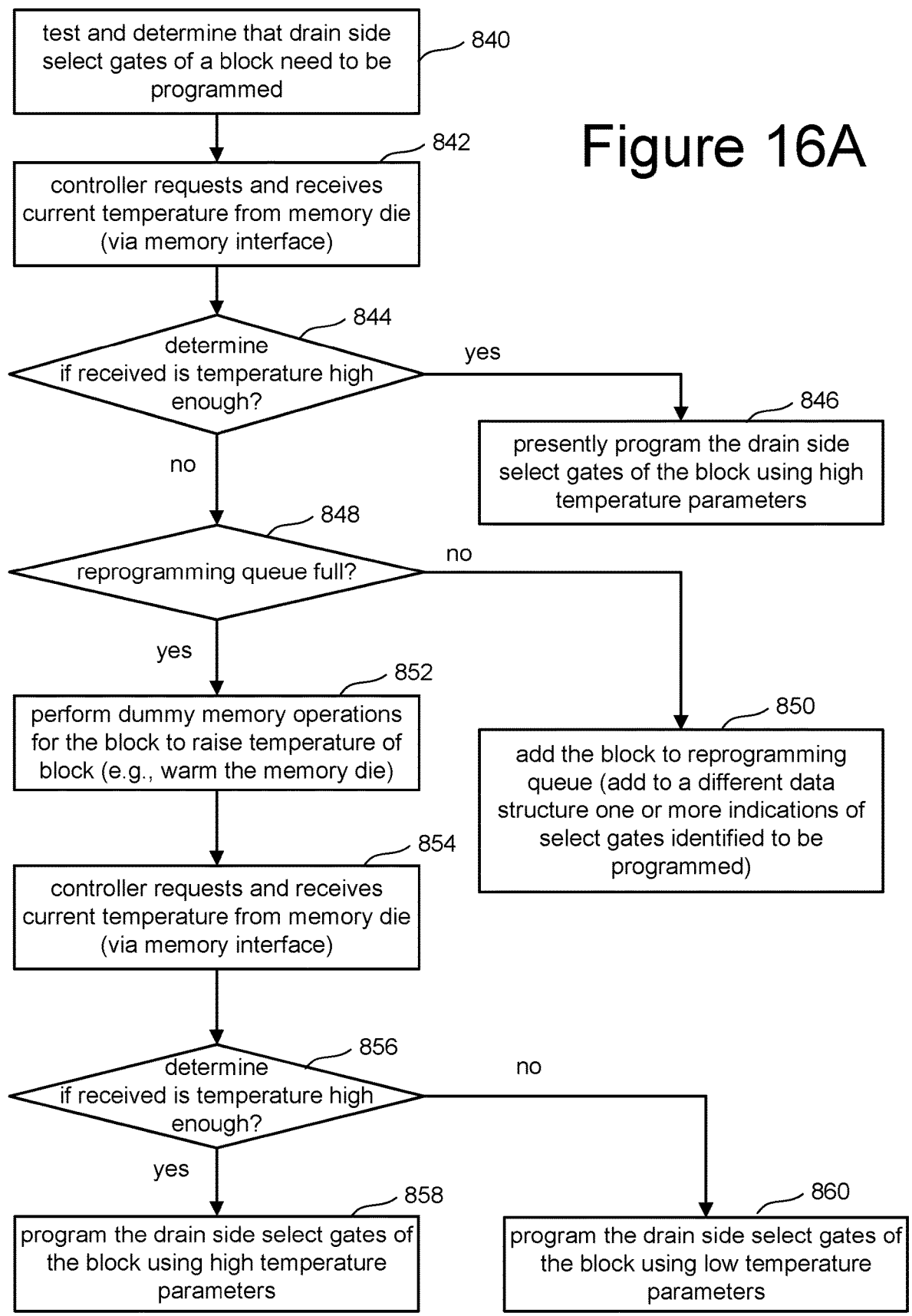
FIG. 16A is a flow chart describing one embodiment of a process for adjusting (e.g. programming or otherwise changing) threshold voltages of select gates as a function of temperature.

FIG. 16A is a flowchart describing another embodiment of a process for adjusting (e.g. programming) threshold voltages of select gates as a function of temperature. In one embodiment, the process of FIG. 16A is performed by or at the direction of one or more control circuits mentioned above. For example, the process of FIG. 16A can be performed by or at the direction of controller 102. In one example implementation, controller 102 performs the process of FIG. 16A by sending instructions to a memory die 300 to perform the various tasks/operations. In one embodiment, the process of FIG. 16A can be thought of as an example implementation of the process of FIG. 7 and/or FIG. 15.

In step 840 of FIG. 16A, controller 102 tests and determines that drain side select gates of a block need to be programmed. In this embodiment, the testing of select gates and the programming of select gates is done on a block basis. Step 840 can be implemented by the process of FIG. 9. In step 842, controller 102 requests and receives current temperature information from memory die 300 via the memory interface. In step 844, controller 102 determines if the temperature received from the memory die is high enough. For example controller 102 determines whether the temperature is higher than the minimum temperature, where the minimum temperature is some temperature chosen between 40° Celsius and 85° Celsius. If the temperature is high enough, then in step 846, controller 102 presently programs the drain side select gates of the block using high temperature parameters. In one embodiment, the process of 16A is performed on for each block separately. In another embodiment, the process of FIG. 16A can be performed concurrently on multiple blocks. In step 846, controller 102 will presently program the drain side select gates. The term "presently program" refers to programming the drain side select gates at the present time rather than deferring it to a later time.

Step 846 also includes programming using high temperature parameters. In one embodiment, the memory system will include high temperature parameters and low temperature parameters. The high temperature parameters will differ from the low temperature parameters in order to maximize programming efficiency for high temperature versus low temperature. In one example implementation, the differences between high temperature parameters and low temperature parameters includes different starting program voltages for the series of voltage pulses referred to in FIG. 14A as Vsgd_pgm, the maximum number of program loops allowed to be performed (e.g. the number of iterations of the process of FIG. 12); and the programming verify level (e.g. Vsgv). There will be one set of these three parameters for high temperatures and a second set of these three parameters for low temperatures.

If it is determined in step 844 that the determined temperature is not high enough (e.g. below 40° Celsius), then controller 102 will consider storing an indication of the block (which is an indication of the select gates that need to be re-programmed) in a re-programming queue. Controller 102 maintains a re-programming queue in DRAM 106 (see FIG. 1A). The re-programming queue include a list of blocks that need to have their select gates programmed. In general, controller 102 maintain a set of blocks that are available to be used for storing new data. It is required to properly service a host that there be at least a minimum number of blocks available for the host to use to store data. If too many blocks are put into the re-programming queue, then there will not be enough blocks available to store host data. Therefore, there is a limit on how many blocks can be in the re-programming queue because while blocks are in the re-programming queue they are not available to store host data. Therefore in step 848, controller 102 determines whether the re-programming queue is full. If the re-programming queue is not full, then in step 850 controller 102 adds the block being operated on to the re-programming queue. In another embodiment, different types of data structures, other than a programming queue, can be used such that step 850 includes adding one or more indications of select gates to be identified to be programmed to a different type of data structure.

If the re-programming queue is full (step 848), then in step 852 controller 102 performs multiple dummy memory operations (e.g. multiple dummy read operations) for the block in order to raise the temperature of the block (e.g. cause the block to become warmer). In step 854, controller 102 requests and receives the current temperature from the memory die 300 (via the memory interface). In step 856, controller 102 determines whether the temperature received is high enough (e.g. greater than a minimum temperature). If the temperature is high enough (e.g., due to warming of the memory die from the dummy memory operations) then in step 858 controller 102 programs the drain side select gates of the block using the high temperature parameters. If, however, the temperature is not high enough (step 856), then in step 860 the controller programs the drain side select gates of the block using low temperature parameters. Note that steps 858 and 860 are performed by controller 102 sending one or more instructions to the memory die 300 to perform the programming using the identified either high temperature parameters or low temperature parameters.

Figure 16B:
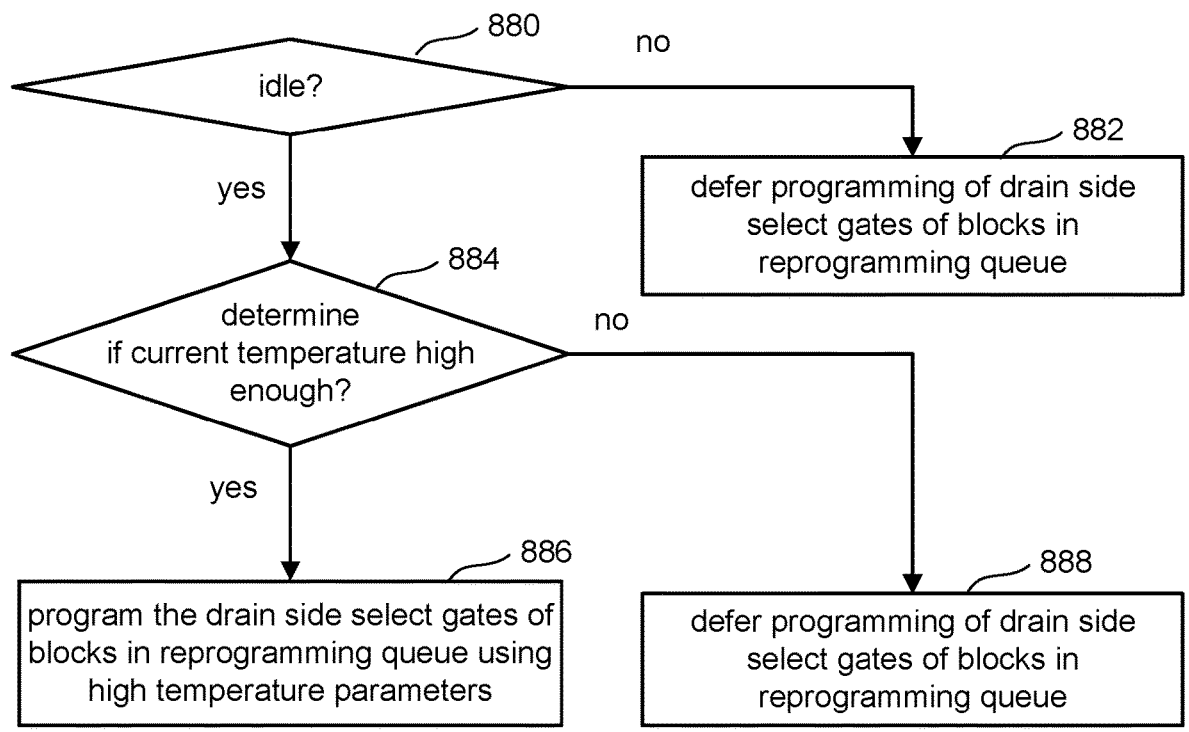
FIG. 16B is a flow chart describing one embodiment of a process for adjusting (e.g. programming or otherwise changing) threshold voltages of select gates during idle time based on a reprogramming queue.

Step 850 of FIG. 16A includes adding the block to the re-programming queue. FIG. 16 is a flowchart describing one embodiment of a process for operating on blocks in the programming queue. In step 880, controller 102 determines whether it is idle. If controller 102 is not idle (or the memory system is not idle or the memory die is not idle), then in step 882, controller 102 defers programming of the drain side select gates of the blocks in the re-programming queue to a later time when the controller or system is idle and the temperature is high enough. If, however, controller 102 determines that controller 102 is idle (or the memory system is idle or the memory die is idle), then in step 884 controller 102 determines if the current temperature is high enough. That is, controller 102 will send a request for current temperature to memory die 300, which will use temperature detection circuit 318 to sense the current temperature and send that current temperature back to controller 102. If the current temperature is high enough (e.g. greater than a minimum temperature) then controller 102 programs the drain side select gates of one or more blocks in the re-programming queue using the high temperature parameters. If the temperature is not high enough (step 884) then in step 888 controller 102 defers to a later time the programming of the drain side select gates of blocks in the re-programming queue.

Figure 17:
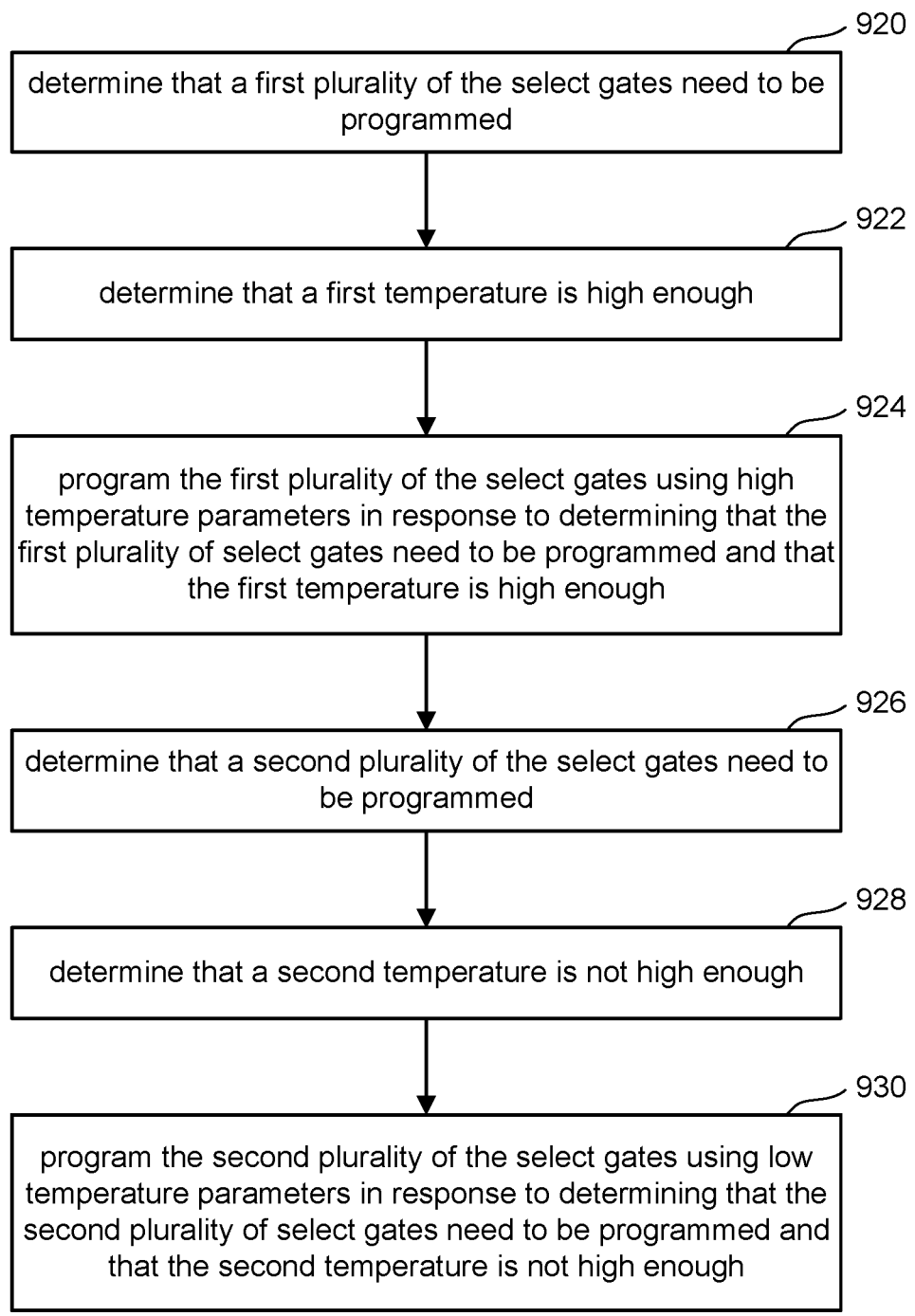
FIG. 17 is a flow chart describing one embodiment of a process for adjusting (e.g. programming or otherwise changing) threshold voltages of select gates as a function of temperature.

FIG. 17 is a flowchart describing another embodiment of a process for adjusting threshold voltages of select gates as a function of temperature. In one example, FIG. 17 describes an implementation of or use of the process of FIGS. 16A and 16B. The process of FIG. 17 is performed by or at the direction of one or more control circuits mentioned above. For example, the process of FIG. 17 can be performed by or at the direction of controller 102. In one example implementation, controller 102 performs the process of FIG. 17 by sending instructions to memory die 300 to perform the various tasks/operations.

In step 920 of FIG. 17, the one or more control circuits determine that a first plurality of select gates need to be programed. For example, step 840 of FIG. 16A can be performed. In step 922, the one or more control circuits determine that a first temperature is high enough. For example, step 844 of FIG. 16A is performed. The first temperature is just the current temperature at a first time. In step 924, the one or more control circuits program the first plurality of select gates using high temperature parameters in response to determining that the first plurality of select gates need to be programmed and that the first temperature is high enough. Step 924 of FIG. 17 includes performing step 846 of FIG. 16A. In step 926, the one or more control circuits determine that a second plurality of select gates need to be programmed. Step 926 is an additional performance of step 840 of FIG. 16A for a different set of select gates in a different block or in the same block. In step 928, the one or more control circuits determine that a second temperature is not high enough. The second temperature is the current temperature at a second time frame. The temperature is not high enough because it is, for example, lower than a minimum temperature (as discussed above). Step 928 of FIG. 17 can be analogous to step 844 of FIG. 16A or step 856 of FIG. 16A. In step 930 of FIG. 17, the one or more control circuits program the second plurality of select gates using low temperature parameters in response to determining that the second plurality of select gates need to be programmed and that the second temperature is not high enough. For example, step 930 can include performing step 860 of FIG. 16A.

In one embodiment, the evaluation and adjustment of the select gates are performed after the first five thousand (or a different number of) program-erase cycles and then after every one thousand (or another number of) program-erase cycles.

One embodiment includes a non-volatile storage apparatus, comprising a plurality of non-volatile memory cells arranged in groups of memory cells and one or more control circuits in communication with the plurality of non-volatile memory cells. Each group of memory cells comprising data memory cells and one or more select gates. The select gates are programmable. The one or more control circuits are configured to program a select gate identified to be programmed if a temperature at the non-volatile memory cells is greater than a minimum temperature and defer programming the select gate identified to be programmed if the temperature at the non-volatile memory cells is not greater than the minimum temperature.

One embodiment includes a non-volatile memory system comprising a memory die and a controller connected to the memory die. The memory die includes a plurality of non-volatile storage elements arranged in groups of connected non-volatile storage elements. Each group of connected non-volatile storage elements comprising one or more select gates. The select gates have programmable threshold voltages. The controller is configured to identify select gates to be programmed. The controller is configured to request temperature from the memory die. The controller is configured to presently program select gates identified to be programmed if the temperature is high enough. The controller is configured to add to a data structure one or more indications of select gates identified to be programmed if the temperature is not high enough. The controller is configured to program select gates indicated in the data structure during a future idle time when the temperature is high enough.

One embodiment includes an apparatus comprising a host interface configured to communicate with a host device; a memory interface configured to interface with a non-volatile memory array comprising vertical NAND strings arranged in blocks, the vertical NAND strings include multiple drain side select gates per vertical NAND string and source side select gates; and means for programming threshold voltage of select gates as a function of temperature. The means for programming threshold voltage of select gates as a function of temperature is connected to the host interface and the memory interface. The means for programming threshold voltage of select gates as a function of temperature is configured to test and determine that drain side select gates of a first block need to be programmed, receive a temperature via the memory interface, determine if the received temperature is high enough, program the drain side select gates of the first block using high temperature parameters if the temperature is high enough, add the first block to a queue if the temperature is not high enough and the queue is not full, program drain side select gates for blocks in the queue using high temperature parameters during idle time for the one or more processors when the temperature is high enough, perform dummy memory operations for the first block if the temperature is not high enough and the queue is full, and after performing the dummy operations, program drain side select gates for the first block using high temperature parameters if the temperature is high enough and program drain side select gates for the first block using low temperature parameters if the temperature is not high enough.

In one embodiment, the means for programming threshold voltage of select gates as a function of temperature can comprises software running on a processor, such as controller 102, memory processor 156, and/or or processor 220 performing the processes of FIGS. 7, 9, 10A, 11, 12, 15, 16A, 16B and/or 17. Other software or hardware that are part of a memory controller and/or memory die can also be used.

One embodiment includes a method of operating a non-volatile storage system that comprises a plurality of non-volatile memory cells arranged in groups of memory cells. Each group of memory cells comprises one or more select gates. The select gates are programmable. The method comprises determining that a first plurality of the select gates need to be programmed; determining that a first temperature is high enough; programming the first plurality of the select gates using high temperature parameters in response to determining that the first plurality of select gates need to be programmed and that the first temperature is high enough; determining that a second plurality of the select gates need to be programmed; determining that a second temperature is not high enough; and programming the second plurality of the select gates using low temperature parameters in response to determining that the second plurality of select gates need to be programmed and that the second temperature is not high enough.

One embodiment includes a non-volatile storage apparatus, comprising a plurality of non-volatile memory cells arranged in groups of memory cells and one or more control circuits in communication with the plurality of non-volatile memory cells. Each group of memory cells comprising data memory cells and one or more select gates. The select gates are programmable. The one or more control circuits are configured to identify a select gate to be programmed. The one or more control circuits are configured to program the select gate identified to be programmed if a temperature at the non-volatile memory cells is greater than a minimum temperature. The one or more control circuits are configured to perform dummy memory operations on the plurality of non-volatile memory cells to raise the temperature of the non-volatile memory cells in response to determining that the temperature at the non-volatile memory cells is not greater than the minimum temperature. The one or more control circuits configured to program the select gate identified to be programmed after performing the dummy memory operations.

For purposes of this document, reference in the specification to "an embodiment," "one embodiment," "some embodiments," or "another embodiment" may be used to describe different embodiments or the same embodiment.

For purposes of this document, a connection may be a direct connection or an indirect connection (e.g., via one or more others parts). In some cases, when an element is referred to as being connected or coupled to another element, the element may be directly connected to the other element or indirectly connected to the other element via intervening elements. When an element is referred to as being directly connected to another element, then there are no intervening elements between the element and the other element. Two devices are "in communication" if they are directly or indirectly connected so that they can communicate electronic signals between them.

For purposes of this document, the term "based on" may be read as "based at least in part on."

For purposes of this document, without additional context, use of numerical terms such as a "first" object, a "second" object, and a "third" object may not imply an ordering of objects, but may instead be used for identification purposes to identify different objects.

For purposes of this document, the term "set" of objects may refer to a "set" of one or more of the objects.

The foregoing detailed description has been presented for purposes of illustration and description. It is not intended to be exhaustive or to limit to the precise form disclosed. Many modifications and variations are possible in light of the above teaching. The described embodiments were chosen in order to best explain the principles of the proposed technology and its practical application, to thereby enable others skilled in the art to best utilize it in various embodiments and with various modifications as are suited to the particular use contemplated. It is intended that the scope be defined by the claims appended hereto.

What is claimed is:

1. A non-volatile storage apparatus, comprising:
a plurality of non-volatile memory cells arranged in groups of memory cells, each group of memory cells comprising data memory cells and one or more select gates, the select gates are programmable; and
one or more control circuits in communication with the plurality of non-volatile memory cells, the one or more control circuits are configured to:
determine that a select gate should be programmed,
determine whether a temperature at the non-volatile memory cells is greater than a minimum temperature,
program the select gate in response to determining that the select gate should be programmed and in response to determining that the temperature at the non-volatile memory cells is greater than the minimum temperature, and
defer programming of the select gate in response to determining that the select gate should be programmed if the temperature at the non-volatile memory cells is not greater than the minimum temperature.

2. The non-volatile storage apparatus of claim 1, wherein: the one or more control circuits are configured to defer programming of the select gate identified to be programmed until the temperature at the non-volatile memory cells is greater than the minimum temperature.

3. The non-volatile storage apparatus of claim 1, wherein: the one or more control circuits are configured to determine that the select gate should be programmed by testing whether a threshold voltage of the select gate is within an acceptable range of threshold voltages.

4. The non-volatile storage apparatus of claim 1, wherein: the one or more control circuits are configured to program the select gate by first lowering a threshold voltage for the select gate and subsequently raising the threshold voltage for the select gate.

5. The non-volatile storage apparatus of claim 1, wherein: the one or more control circuits are configured to program the select gate by adjusting a threshold voltage of the select gate.

6. The non-volatile storage apparatus of claim 1, wherein: the one or more control circuits are configured to program the select gate by adjusting a non-volatile property of the select gate.

7. The non-volatile storage apparatus of claim 1, wherein: the one or more control circuits are configured to perform dummy memory operations on the plurality of non-volatile memory cells to raise the temperature of the non-volatile memory cells in response to determining that the temperature at the non-volatile memory cells is not greater than the minimum temperature, the one or more control circuits are configured to program the select gate after performing the dummy memory operations on the plurality of non-volatile memory cells.

8. The non-volatile storage apparatus of claim 1, wherein: the one or more control circuits are configured to perform multiple read operations on the plurality of non-volatile memory cells to raise the temperature of the non-volatile memory cells in response to determining that the temperature at the non-volatile memory cells is not greater than the minimum temperature, the multiple read operations are not performed in response to a request to read from a host in communication with the non-volatile storage apparatus, the one or more control circuits are configured to program the select gate after performing the read operations on the plurality of non-volatile memory cells.

9. The non-volatile storage apparatus of claim 1, wherein: the plurality of non-volatile memory cells comprise vertical NAND strings with charge trapping regions, the vertical NAND strings include multiple drain side select gates per vertical NAND string and source side select gates, the select gate that should be programmed is one of the drain side select gates.

10. The non-volatile storage apparatus of claim 1, wherein:
the plurality of non-volatile memory cells are positioned on a memory die; and
the one or more control circuits comprise a controller connected to the memory die, the controller is configured to request the temperature at the non-volatile memory cells from the memory die.

11. A non-volatile storage apparatus, comprising:
a plurality of non-volatile memory cells arranged in groups of memory cells, each group of memory cells comprising data memory cells and one or more select gates, the select gates are programmable; and
one or more control circuits in communication with the plurality of non-volatile memory cells, the one or more control circuits are configured to:

identify a select gate to be programmed,
program the identified select gate if a temperature at the storage apparatus is greater than a minimum temperature,
defer programming of the select gate identified to be programmed to a later time and add to a data structure an indication of the select gate identified to be programmed if the temperature is not greater than the minimum temperature, and
program the select gate indicated in the data structure during a future idle time when the temperature is greater than the minimum temperature.

12. A non-volatile storage apparatus, comprising:
a plurality of non-volatile memory cells arranged in a plurality of blocks, each of the blocks comprises groups of non-volatile memory cells, each group of non-volatile memory cells comprises data memory cells and one or more select gates, the select gates are programmable, the plurality of blocks includes a first block; and
one or more control circuits in communication with the plurality of non-volatile memory cells, the one or more control circuits are configured to:
test and determine that select gates of the first block are to be programmed,
determine if a current temperature is greater than a minimum temperature,
program the select gates of the first block using high temperature parameters if the current temperature is greater than the minimum temperature,
add the first block to a queue if the current temperature is not greater than the minimum temperature and the queue is not full,
program select gates for blocks in the queue using high temperature parameters during idle time for the one or more control circuits when the temperature is greater than the minimum temperature,
perform dummy memory operations for the first block if the temperature is not greater than the minimum temperature and the queue is full, and
after performing the dummy operations, program select gates for the first block using high temperature parameters if the temperature is greater than the minimum temperature and program select gates for the first block using low temperature parameters if the temperature is not greater than the minimum temperature.

13. A non-volatile memory system, comprising:
a memory die, the memory die includes a plurality of non-volatile storage elements arranged in groups of connected non-volatile storage elements, each group of connected non-volatile storage elements comprising one or more select gates, the select gates have programmable threshold voltages; and
a controller connected to the memory die, the controller is configured to identify select gates to be programmed, the controller is configured to request temperature from the memory die, the controller is configured to presently program select gates identified to be programmed if the temperature is greater than a minimum temperature, the controller is configured to defer programming of the select gates identified to be programmed to a later time and add to a data structure one or more indications of the select gates identified to be programmed if the temperature is not greater than the minimum temperature, the controller is configured to program select gates indicated in the data structure during a future idle time when the temperature is greater than the minimum temperature.

14. A non-volatile memory system, according to claim 13, wherein:
the controller is configured to perform dummy memory operations on the memory die to warm the memory die if the temperature is not greater than the minimum temperature and program select gates identified to be programmed after performing the dummy memory operations on the memory die.

15. A non-volatile memory system, according to claim 13, wherein:
the memory die includes a temperature sensor, the memory die uses the temperature sensor to sense temperature and report the temperature in response to the request for temperature from the controller.

* * * * *